(12) United States Patent
Jang et al.

(10) Patent No.: US 11,855,121 B2
(45) Date of Patent: Dec. 26, 2023

(54) LED CHIP AND MANUFACTURING METHOD OF THE SAME

(71) Applicant: Seoul Viosys Co., Ltd., Ansan-si (KR)

(72) Inventors: Jong Min Jang, Ansan-si (KR); Chang Yeon Kim, Ansan-si (KR); Myoung Hak Yang, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/848,914

(22) Filed: Apr. 15, 2020

(65) Prior Publication Data

US 2020/0365647 A1 Nov. 19, 2020

Related U.S. Application Data

(60) Provisional application No. 62/866,519, filed on Jun. 25, 2019, provisional application No. 62/847,836, filed on May 14, 2019.

(51) Int. Cl.
*H01L 27/15* (2006.01)
*H01L 25/075* (2006.01)
(Continued)

(52) U.S. Cl.
CPC .......... *H01L 27/15* (2013.01); *H01L 25/0753* (2013.01); *H01L 33/007* (2013.01);
(Continued)

(58) Field of Classification Search
CPC ... H01L 27/15; H01L 25/0753; H01L 33/007; H01L 33/0095; H01L 33/38; H01L 33/44;
(Continued)

(56) References Cited

U.S. PATENT DOCUMENTS 5,696,389 A 12/1997 Ishikawa et al.
8,952,416 B2 2/2015 Jeong
(Continued)

FOREIGN PATENT DOCUMENTS

EP 2768033 8/2014
EP 3944315 A1 1/2022
(Continued)

OTHER PUBLICATIONS

International Search Report dated Aug. 21, 2020, for PCT/KR2020/006114.
(Continued)

*Primary Examiner* — Su C Kim
(74) *Attorney, Agent, or Firm* — H.C. Park & Associates, PLC

(57) ABSTRACT

A light emitting chip including a first LED sub-unit, a second LED sub-unit disposed on the first LED sub-unit, a third LED sub-unit disposed on the second LED sub-unit, a first bonding layer interposed between the first and second LED sub-units, a second bonding layer interposed between second and third LED sub-units, and a first connection electrode electrically connected to and overlapping at least one of the first, second, and third LED sub-units, the first connection electrode having first and second opposing side surfaces, the first side surface having a first length and the second side surface having a second length, in which the difference in length between the first side surface and the second side surface of the first connection electrode is greater than a thickness of at least one of the LED sub-units.

14 Claims, 17 Drawing Sheets

(51) Int. Cl.
*H01L 33/00* (2010.01)
*H01L 33/38* (2010.01)
*H01L 33/54* (2010.01)
*H01L 33/62* (2010.01)
*H01L 33/44* (2010.01)

(52) U.S. Cl.
CPC .......... *H01L 33/0095* (2013.01); *H01L 33/38* (2013.01); *H01L 33/44* (2013.01); *H01L 33/54* (2013.01); *H01L 33/62* (2013.01); *H01L 2933/005* (2013.01); *H01L 2933/0016* (2013.01); *H01L 2933/0025* (2013.01); *H01L 2933/0066* (2013.01)

(58) Field of Classification Search
CPC . H01L 33/54; H01L 33/62; H01L 2933/0016; H01L 2933/0025; H01L 2933/005; H01L 2933/0066; H01L 27/153
See application file for complete search history.

(56) References Cited

U.S. PATENT DOCUMENTS

| | | | |
|---|---|---|---|
| 9,006,764 | B2 | 4/2015 | Akimoto et al. |
| 10,210,785 | B2 | 2/2019 | Sagardoyburu |
| 10,937,924 | B2 | 3/2021 | Zou et al. |
| 11,282,981 | B2 | 3/2022 | Kim et al. |
| 11,322,488 | B2 | 5/2022 | Chang |
| 11,450,648 | B2 | 9/2022 | Jang et al. |
| 11,587,914 | B2 | 2/2023 | Jang et al. |
| 2003/0213967 | A1 | 11/2003 | Forrest et al. |
| 2006/0255343 | A1* | 11/2006 | Ogihara ............... H01L 24/24 257/82 |
| 2007/0069220 | A1 | 3/2007 | Ogihara |
| 2007/0170444 | A1* | 7/2007 | Cao ...................... H01L 33/382 257/E33.012 |
| 2008/0251799 | A1 | 10/2008 | Ikezawa |
| 2008/0308819 | A1 | 12/2008 | Louwsma et al. |
| 2009/0078955 | A1 | 3/2009 | Fan et al. |
| 2010/0051975 | A1 | 3/2010 | Suzuki et al. |
| 2011/0186876 | A1 | 8/2011 | Suzuki et al. |
| 2013/0161628 | A1 | 6/2013 | Suzuki et al. |
| 2014/0217438 | A1* | 8/2014 | Tomizawa ............. H01L 24/92 438/26 |
| 2014/0284633 | A1 | 9/2014 | Tsay et al. |
| 2016/0163765 | A1 | 6/2016 | Hu et al. |
| 2017/0069681 | A1 | 3/2017 | Lee et al. |
| 2017/0077367 | A1* | 3/2017 | Shimojuku ............ H01L 33/44 |
| 2017/0288093 | A1 | 10/2017 | Cha et al. |
| 2017/0309678 | A1 | 10/2017 | Yang et al. |
| 2017/0338210 | A1 | 11/2017 | Kim et al. |
| 2019/0006413 | A1 | 1/2019 | Jacob et al. |
| 2019/0006561 | A1 | 1/2019 | Chun-Hung et al. |
| 2020/0219858 | A1 | 7/2020 | Chang |
| 2020/0365648 | A1 | 11/2020 | Jang et al. |

FOREIGN PATENT DOCUMENTS

| | | |
|---|---|---|
| KR | 10-2015-0002113 A | 1/2015 |
| KR | 10-2016-0042767 | 4/2016 |
| WO | 2018064805 | 4/2018 |
| WO | 2019004508 | 1/2019 |
| WO | 2019103566 A1 | 5/2019 |
| WO | 2020231108 A1 | 11/2020 |

OTHER PUBLICATIONS

Final Office Action dated Apr. 4, 2022, in U.S. Appl. No. 16/852,522.
Non-Final Office Action dated Dec. 21, 2021, in U.S. Appl. No. 16/849,842.
Non-Final Office Action dated Dec. 21, 2021, in U.S. Appl. No. 16/858,674.
Non-Final Office Action dated Oct. 6, 2021, in U.S. Appl. No. 16/852,522.
Non-Final Office Action dated Nov. 9, 2022, in U.S. Appl. No. 16/858,674.
Notice of Allowance dated May 1, 2023, in U.S. Appl. No. 16/858,674.
Non-Final Office Action dated Sep. 1, 2022, in U.S. Appl. No. 16/852,522.
Final Office Action dated Aug. 4, 2022, in U.S. Appl. No. 16/849,842.
Extended European Search Report dated Apr. 13, 2023, issued in European Patent Application No. 20805270.4.
Extended European Search Report dated Apr. 25, 2023, issued in European Patent Application No. 20805420.5.
Extended European Search Report dated May 2, 2023, issued in European Patent Application No. 20804781.1.
Extended European Search Report dated Apr. 28, 2023, issued in European Patent Application No. 20804981.7.
Notice of Allowance dated Dec. 21, 2022, in U.S. Appl. No. 16/855,522.
Non-Final Office Action dated Dec. 13, 2022, in U.S. Appl. No. 16/849,842.
Non-Final Office Action dated Jul. 21, 2022, in U.S. Appl. No. 16/858,674.
Final Office Action dated Jun. 5, 2023, in U.S. Appl. No. 16/849,842.
Notice of Allowance dated Sep. 27, 2023, in U.S. Appl. No. 16/849,842.

* cited by examiner

LED CHIP AND MANUFACTURING METHOD OF THE SAME

CROSS-REFERENCE TO RELATED APPLICATIONS

This application claims the benefit of U.S. Provisional Application No. 62/847,836, filed on May 14, 2019, and U.S. Provisional Application No. 62/866,519, filed on Jun. 25, 2019, each of which is hereby incorporated by reference for all purposes as if fully set forth herein.

BACKGROUND

Field

Exemplary embodiments of the invention relate to a light emitting chip for a display and a manufacturing method of the same and, more specifically, to a micro light emitting chip having a stacked structure and a manufacturing method of the same.

Discussion of the Background

As an inorganic light source, light emitting diodes (LEDs) have been used in various technical fields, such as displays, vehicular lamps, general lighting, and the like. With advantages of long lifespan, low power consumption, and high response speed, light emitting diodes have been rapidly replacing an existing light source.

Light emitting diodes have been mainly used as backlight light sources in display apparatus. However, micro-LED displays have been recently developed that are capable of implementing an image directly using the light emitting diodes.

In general, a display apparatus implements various colors by using mixed colors of blue, green and, red light. The display apparatus includes pixels each having sub-pixels corresponding to blue, green, and red colors, and a color of a certain pixel may be determined based on the colors of the sub-pixels therein, and an image can be displayed through combination of the pixels.

Since LEDs can emit various colors depending upon its constituent materials, a display apparatus may typically have individual LED chips emitting blue, green, and red light arranged on a two-dimensional plane. However, when one LED chip is provided for each sub-pixel, the number of LED chips required to be mounted to form a display device becomes very large, e.g., over hundreds of thousands or millions, which may require a significant amount of time and complexity for the mounting process. Moreover, since the sub-pixels are arranged on the two-dimensional plane in a display apparatus, a relatively large area is required for one pixel including the sub-pixels for blue, green, and red light, and reducing the luminous area of each sub-pixel would deteriorate the brightness of the subpixels.

Moreover, micro-LEDs typically have a very small size with a surface area of about 10,000 square µm or less, and thus, various technical problems arise due to this small size. For example, an array of micro-LEDs is formed on a substrate, and the micro-LEDs may be singularized into each micro-LED chip by cutting the substrate. The individualized micro-LED chips may then be mounted on another substrate, such as a printed circuit board, during which various transferring technologies may be employed. However, during these transferring steps, handling of each micro-LED chip is generally difficult due to its small size and its vulnerable structure.

The above information disclosed in this Background section is only for understanding of the background of the inventive concepts, and, therefore, it may contain information that does not constitute prior art.

SUMMARY

Light emitting chips constructed according to the principles and some exemplary implementations of the invention are capable of protecting the light emitting stacked structures during various transferring processes.

Light emitting chips and a display using the same, e.g., micro-LEDs, constructed according to the principles and some exemplary implementations of the invention have a simplified structure that reduces the time for the mounting process during manufacture.

Additional features of the inventive concepts will be set forth in the description which follows, and in part will be apparent from the description, or may be learned by practice of the inventive concepts.

A light emitting chip according to an exemplary embodiment includes a first LED sub-unit, a second LED sub-unit disposed on the first LED sub-unit, a third LED sub-unit disposed on the second LED sub-unit, a first bonding layer interposed between the first and second LED sub-units, a second bonding layer interposed between second and third LED sub-units, and a first connection electrode electrically connected to and overlapping at least one of the first, second, and third LED sub-units, the first connection electrode having first and second opposing side surfaces, the first side surface having a first length and the second side surface having a second length, in which the difference in length between the first side surface and the second side surface of the first connection electrode is greater than a thickness of at least one of the LED sub-units.

The light emitting chip may further include a substrate on which the first LED sub-unit is disposed, and a passivation layer at least partially surrounding the first connection electrode and exposing a side surface of the substrate.

The first side surface may face the outside of the light emitting chip and the second side surface may face the center of the light emitting chip.

The passivation layer may expose a side surface of the first LED sub-unit, and cover side surfaces of at least one of the second and third LED sub-units.

The passivation layer may include at least one of an epoxy molding compound and a polyimide film, and the passivation layer may cover an upper surface of the third LED sub-unit.

The passivation layer may transmit light emitted from the first, second, and third LED sub-units.

A thickness of a portion of the passivation layer overlapping the third LED sub-unit may be less than about 100 µm.

The light emitting chip may further include a second connection electrode electrically connected to the first LED sub-unit, a third connection electrode electrically connected to the second LED sub-unit, and a fourth connection electrode electrically connected to the third LED sub-unit, in which the first connection electrode may be electrically connected to each of the first, second, and third LED sub-units, and each of the first, second, third, and fourth connection electrodes may have an elongate shape projecting in a direction away from the substrate, such that a top surface thereof is disposed above a top surface of the third LED sub-unit.

A bottom surface of at least one of the first, second, third, and fourth connection electrodes may have a greater area than its respective top surface thereof.

At least one of the first, second, third, and fourth connection electrodes may overlap a side surface of each of the first, second, and third LED sub-units.

The first connection electrode may be electrically connected to each of the first, second, and third LED sub-units via first, second, and third lower contact electrodes, respectively, with the first, second, and third lower contact electrodes being disposed on different planes from each other.

The third LED sub-unit may include a first-type semiconductor layer, an active layer, a second-type semiconductor layer, and an upper contact electrode forming ohmic contact with the first-type semiconductor layer, the first-type semiconductor layer may include a recessed portion, and the upper contact electrode may be formed in the recessed portion of the first-type semiconductor layer.

The light emitting chip may further include a substrate, in which the first LED sub-unit may include a first LED light emitting stack, the second LED sub-unit may include a second LED light emitting stack, the third LED sub-unit may include a third LED light emitting stack, and the first, second, third LED light emitting stacks may have successively smaller regions overlapping with the substrate, and at least one of the light emitting stacks may include a micro-LED having a surface area less than about 10,000 square μm.

The difference in length between the first side surface and the second side surface of the first connection electrode may be in a range of about 3 μm to about 16 μm.

A light emitting package according to another exemplary embodiment includes a light emitting chip including a first LED sub-unit, a second LED sub-unit disposed on the first LED sub-unit, a third LED sub-unit disposed on the second LED sub-unit, and a plurality of connection electrodes disposed on each of the first, second, and third LED sub-units, respectively, a circuit board having a plurality of upper electrodes disposed on a first surface of the circuit board facing the light emitting chip, and connected to the connection electrodes, respectively, and a molding layer covering substantially all of the outer surfaces of the light emitting chip.

The light emitting chip may further include a passivation layer disposed between the connection electrodes, and the passivation layer and the molding layer may include the same material.

The light emitting chip may further include a passivation layer disposed between the connection electrodes, and the passivation layer and the molding layer may include different materials from each other.

A portion of the molding layer disposed on the light emitting chip may have a thickness of less than about 100 μm.

One of the connection electrodes may have first and second opposing side surfaces having a first length and a second length, respectively, and the difference between the first and the second length may be at least about 3 μm.

One of the connection electrodes may overlap a side surface of each of the first, second, and third LED sub-units.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
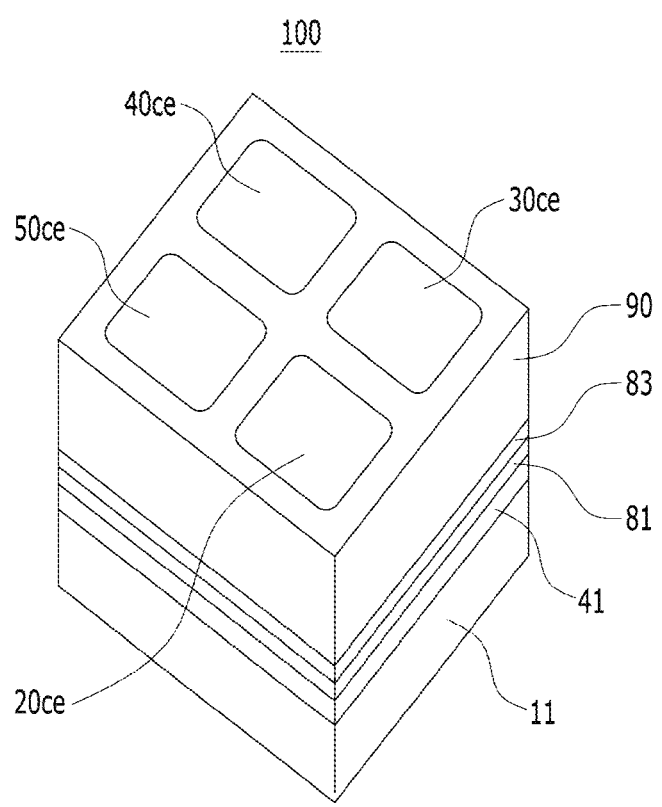
FIG. 1A is a schematic, perspective view of a light emitting chip constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described in detail with reference to the accompanying drawings. As used herein, a light emitting stacked structure, a light emitting chip, or a light emitting package according to exemplary embodiments may include a micro-LED, which has a surface area less than about 10,000 square μm as known in the art. In other exemplary embodiments, the micro-LED's may have a surface area less than about 4,000 square μm, or less than about 2,500 square μm, depending upon the particular application.

Figure 1B:
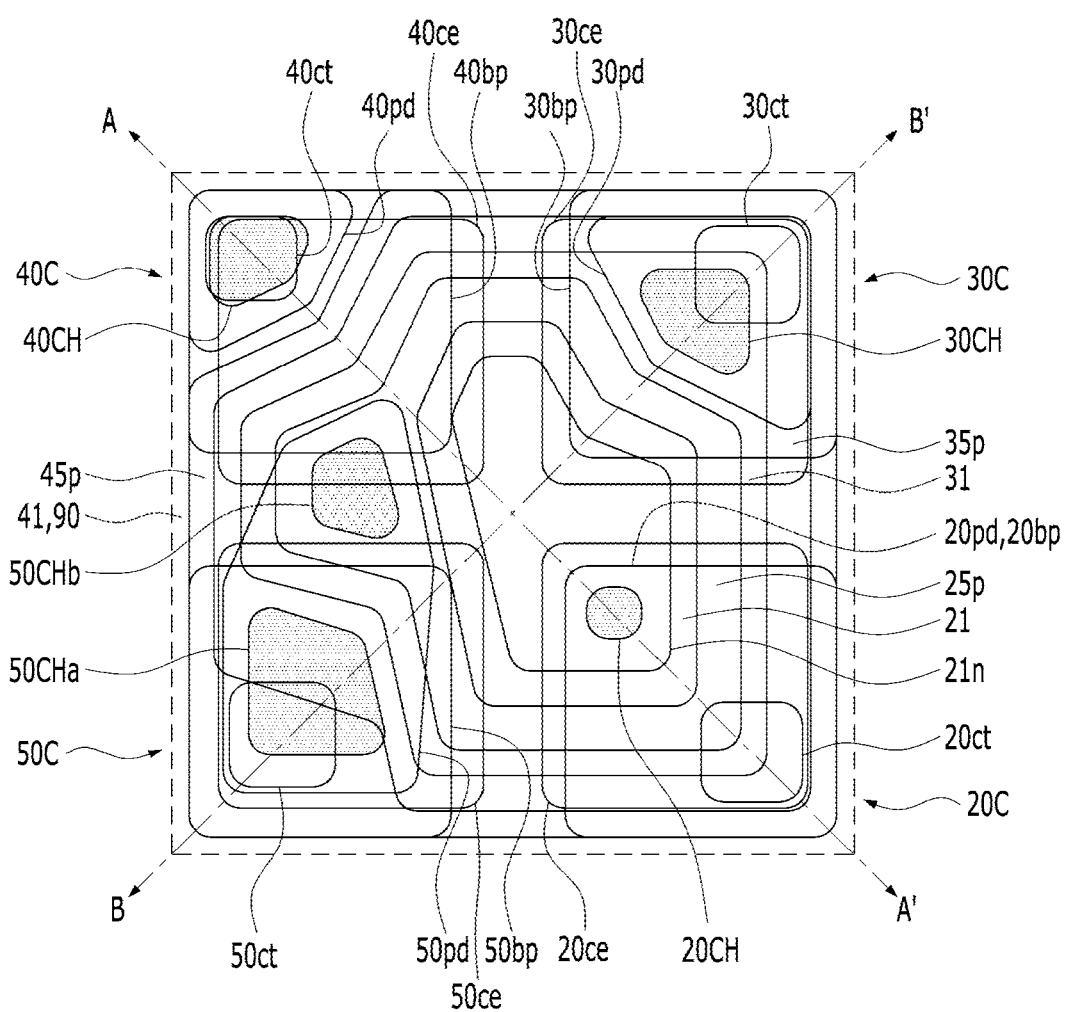
FIG. 1B is a plan view of the light emitting chip of FIG. 1A according to an exemplary embodiment showing underlying structures.
Figure 1C:
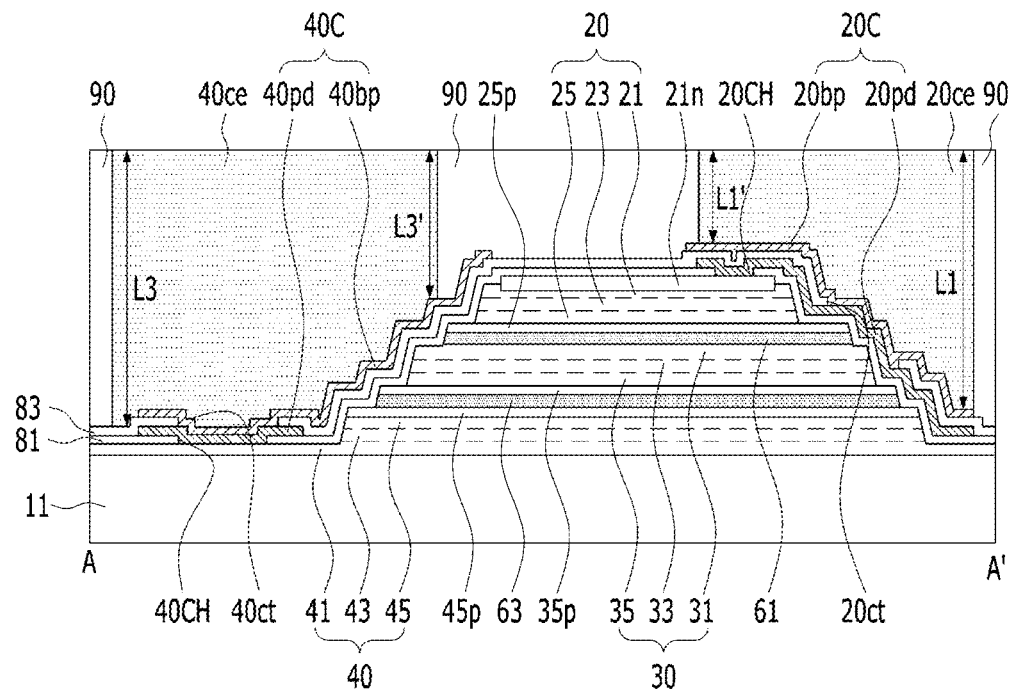
FIGS. 1C and 1D are cross-sectional views respectively taken along line A-A' and line B-B' of the light emitting chip of FIG. 1B according to an exemplary embodiment.
Figure 1D:
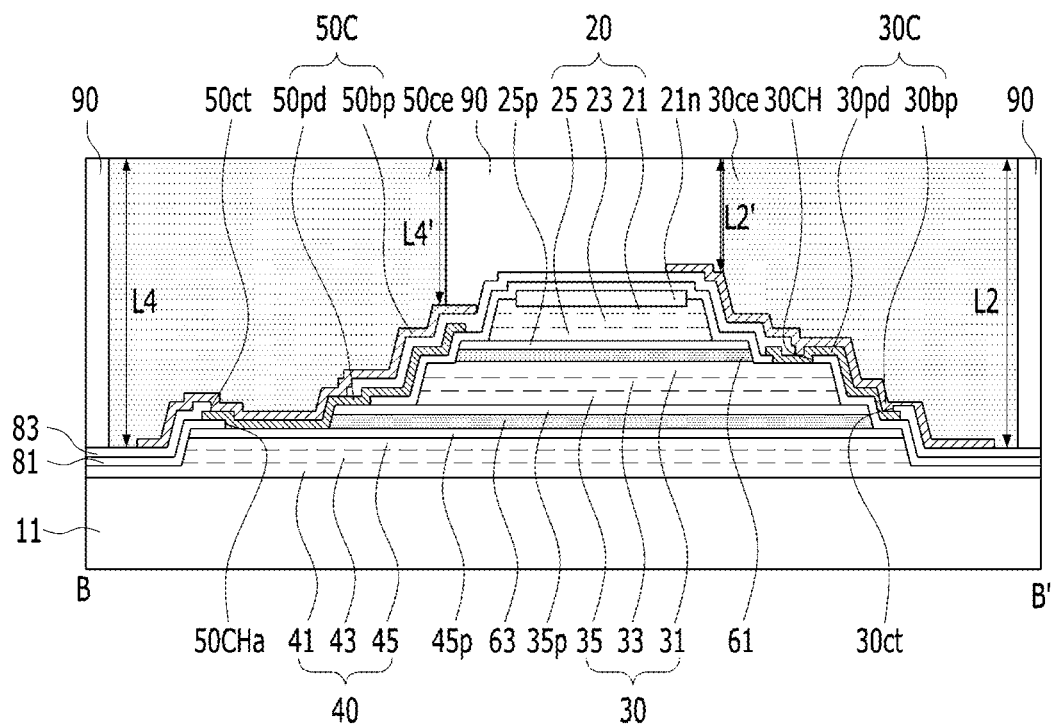
Figure 1E:
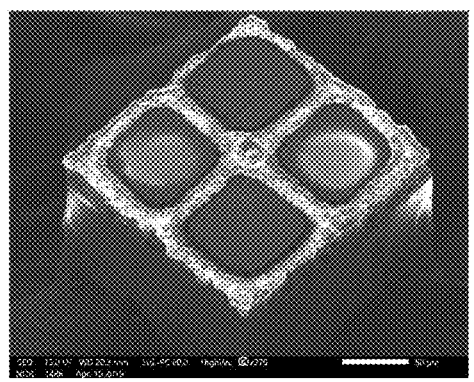
FIG. 1E is a SEM image of the light emitting chip of FIG. 1A according to an exemplary embodiment.

FIG. 1A is a schematic view of a light emitting chip constructed according to an exemplary embodiment of the invention. FIG. 1B is a perspective plan view of the light emitting chip of FIG. 1A according to an exemplary embodiment, FIGS. 1C and 1D are cross-sectional views respectively taken along line A-A' and line B-B' of the light emitting chip of FIG. 1B according to an exemplary embodiment, and FIG. 1E is a SEM image of the light emitting chip of FIG. 1A according to an exemplary embodiment.

Referring to FIGS. 1A and 1B, the light emitting chip 100 according to an exemplary embodiment includes a light emitting stacked structure, a first connection electrode 20ce, a second connection electrode 30ce, a third connection electrode 40ce, and a fourth connection electrode 50ce formed on the light emitting stacked structure, and a passivation layer 90 surrounding the connection electrodes 20ce, 30ce, 40ce, and 50ce. An array of the light emitting chips 100 may be formed on the substrate 11, and the light emitting chip 100 shown in FIG. 1A exemplarily shows one that has been singularized from the array, which will be described in more detail below. In some exemplary embodiments, the light emitting chip 100 including the light emitting stacked structure may be further processed to be formed as a light emitting package, which will be described in more detail later.

Referring to FIGS. 1A to 1D, the light emitting chip 100 according to the illustrated exemplary embodiment includes the light emitting stacked structure, which may include a first LED sub-unit, a second LED sub-unit, and a third LED sub-unit disposed on the substrate 11. The first LED sub-unit may include a first light emitting stack 20, the second LED sub-unit may include a second light emitting stack 30, and the third LED sub-unit may include a third light emitting stack 40. While the drawings show the light emitting stacked structure including three light emitting stacks 20, 30, and 40, the inventive concepts are not limited to a particular number of light emitting stacks formed in the light emitting stacked structure. For example, in some exemplary embodiments, the light emitting stacked structure may include two or more light emitting stacks therein. Hereinafter, the light emitting chip 100 will be described with reference to a light emitting stacked structure including three light emitting stacks 20, 30, and 40 according to an exemplary embodiment.

The substrate 11 may include a light transmitting insulating material to transmit light therethrough. In some exemplary embodiments, however, the substrate 11 may be formed to be semi-transparent to transmit only light having a specific wavelength, or formed to be partially transparent to transmit only a portion of light having the specific wavelength. The substrate 11 may be a growth substrate capable of epitaxially growing the third light emitting stack 40 thereon, such as a sapphire substrate. However, the inventive concepts are not limited thereto, and in some exemplary embodiments, the substrate 11 may include various other transparent insulating materials. For example, the substrate 11 may include a glass, a quartz, a silicon, an organic polymer, or an organic-inorganic composite material, such as silicon carbide (SiC), gallium nitride (GaN), indium gallium nitride (InGaN), aluminum gallium nitride (AlGaN), aluminum nitride (AlN), gallium oxide ($Ga_2O_3$), or silicon substrate. As another example, the substrate 11 in some exemplary embodiments may be a printed circuit board or a composite substrate including electrical lines therein for providing light emitting signals and a common voltage to each of the light emitting stacks formed thereon.

Each of the first, second, and third light emitting stacks 20, 30, and 40 is configured to emit light towards the substrate 11. As such, light emitted from the first light emitting stack 20, for example, may pass through the second and third light emitting stacks 30 and 40. According to an exemplary embodiment, light emitted from each of the first, second, and third light emitting stacks 20, 30, and 40 may have different wavelength bands from each other, and the light emitting stack that is disposed further away from the substrate 11 may emit light having a longer wavelength band. For example, the first, second, and third light emitting stacks 20, 30, and 40 may emit red light, green light, and blue light, respectively. However, the inventive concepts are not limited thereto. As another example, the first, second, and third light emitting stacks 20, 30, and 40 may emit red light, blue light, and green light, respectively. As still another example, in another exemplary embodiment, one or more of the light emitting stacks may emit light having substantially the same wavelength band. As still another example, when the light emitting stacked structure includes a micro-LED, which has a surface area less than about 10,000 square µm as known in the art, or less than about 4,000 square µm or 2,500 square µm in other exemplary embodiments, a light emitting stack that is disposed further away from the substrate 11 may emit light having a shorter wavelength band than light emitted from the one disposed closer to the substrate 11, without adversely affecting operation, due to the small form factor of a micro-LED. In this case, the micro-LED may be operated with low operating voltage, and thus, a separate color filter may not be required between the light emitting stacks. Hereinafter, the first, second, and third light emitting stacks 20, 30, and 40 will be exemplarily described as emitting red light, green light, and blue light, respectively, according to an exemplary embodiment.

The first light emitting stack 20 includes a first-type semiconductor layer 21, an active layer 23, and a second-type semiconductor layer 25. According to an exemplary embodiment, the first light emitting stack 20 may include a semiconductor material that emits red light, such as aluminum gallium arsenide (AlGaAs), gallium arsenide phosphide (GaAsP), aluminum gallium indium phosphide (AlGaInP), and gallium phosphide (GaP), without being limited thereto.

A first upper contact electrode 21n may be disposed on the first-type semiconductor layer 21 and form ohmic contact with the first-type semiconductor layer 21, and a first lower contact electrode 25p may be disposed under the second-type semiconductor layer 25 of the first light emitting stack 20. According to an exemplary embodiment, a portion of the first-type semiconductor layer 21 may be patterned, and the first upper contact electrode 21n may be disposed in the patterned area of the first-type semiconductor layer 21 to increase the level of ohmic contact therebetween. The first upper contact electrode 21n may have a single-layer structure or a multi-layered structure, and may include Al, Ti, Cr, Ni, Au, Ag, Sn, W, Cu, or an alloy thereof, such as Au—Te alloy or an Au—Ge alloy, without being limited thereto. In an exemplary embodiment, the first upper contact electrode 21n may have a thickness of about 100 nm, and include metal having high reflectance to increase light emission efficiency in a downward direction towards the substrate 11.

The second light emitting stack 30 includes a first-type semiconductor layer 31, an active layer 33, and a second-type semiconductor layer 35. According to an exemplary embodiment, the second light emitting stack 30 may include a semiconductor material that emits green light, such as indium gallium nitride (InGaN), gallium nitride (GaN), gallium phosphide (GaP), aluminum gallium indium phosphide (AlGaInP), and aluminum gallium phosphide (AlGaP), without being limited thereto. A second lower contact electrode 35p is disposed under the second-type semiconductor layer 35 of the second light emitting stack 30.

The third light emitting stack 40 includes a first-type semiconductor layer 41, an active layer 43, and a second-type semiconductor layer 45. According to an exemplary embodiment, the third light emitting stack 40 may include a semiconductor material that emits blue light, such as gallium nitride (GaN), indium gallium nitride (InGaN), and zinc selenide (ZnSe), without being limited thereto. A third lower contact electrode 45p is disposed on the second-type semiconductor layer 45 of the third light emitting stack 40.

According to an exemplary embodiment, each of the first-type semiconductor layers 21, 31, and 41 and each of the second-type semiconductor layers 25, 35, and 45 of the first, second, and third light emitting stacks 20, 30, and 40 may have a single-layer structure or a multi-layered structure, and in some exemplary embodiments, may include a superlattice layer. In addition, the active layers 23, 33, and 43 of the first, second, and third light emitting stacks 20, 30, and 40 may have a single quantum well structure or a multiple quantum well structure.

Each of the first, second, and third lower contact electrodes 25p, 35p, and 45p may include a transparent conductive material to transmit light. For example, the lower contact electrodes 25p, 35p, and 45p may include a transparent conductive oxide (TCO), such as tin oxide (SnO), indium oxide ($InO_2$), zinc oxide (ZnO), indium tin oxide (ITO), and indium tin zinc oxide (ITZO), without being limited thereto.

A first adhesive layer 61 is disposed between the first light emitting stack 20 and the second light emitting stack 30, and a second adhesive layer 63 is disposed between the second light emitting stack 30 and the third light emitting stack 40. The first and second adhesive layers 61 and 63 may include a non-conductive material that transmits light. For example, the first and second adhesive layers 61 and 63 may each include an optical clear adhesive (OCA), which may include epoxy, polyimide, SUB, spin-on glass (SOG), benzocyclobutene (BCB), or others, without being limited thereto.

According to the illustrated exemplary embodiment, a first insulating layer 81 and a second insulating layer 83 are disposed on at least a portion of side surfaces of the first, second, and third light emitting stacks 20, 30, and 40. At least one of the first and second insulating layers 81 and 83 may include various organic or inorganic insulating materials, such as polyimide, $SiO_2$, $SiN_x$, $Al_2O_3$ or the like. For example, at least one of the first and second insulating layers 81 and 83 may include a distributed Bragg reflector (DBR). As another example, at least one of the first and second insulating layers 81 and 83 may include a black-colored organic polymer. In some exemplary embodiments, a metal reflection layer that is electrically floated may be further disposed on the first and second insulating layers 81 and 83 to reflect light emitted from the light emitting stacks 20, 30, and 40 towards the substrate 11. In some exemplary embodiments, at least one of the first and second insulating layers 81 and 83 may have a single-layered or a multi-layered structure formed of two or more insulating layers having different refractive indices from each other.

According to an exemplary embodiment, each of the first, second, and third light emitting stacks 20, 30, and 40 may be driven independently. More particularly, one of the first and second-type semiconductor layers of each light emitting stack may be applied with a common voltage, and the other one of the first and second-type semiconductor layers of each light emitting stack may be applied with a respective light emitting signal. For example, according to the illustrated exemplary embodiment, the first-type semiconductor layers 21, 31, and 41 of each light emitting stack may be an n-type, and the second-type semiconductor layers 25, 35, and 45 of each light emitting stack may be a p-type. In this case, the third light emitting stack 40 may have a reversed stacked sequence as compared to the first and second light emitting stacks 20 and 30, such that the p-type semiconductor layer 45 is disposed on top of the active layer 43 to simplify the manufacturing process. Hereinafter, the first-type and second-type semiconductor layers may be interchangeably be referred to as p-type and n-type, respectively, according to the illustrated exemplary embodiment.

Each of the first, second, and third lower contact electrodes 25p, 35p, and 45p respectively connected to the p-type semiconductor layers 25, 35, and 45 of the light emitting stacks may be connected to a fourth contact part 50C, and the fourth contact part 50C may be connected to the fourth connection electrode 50ce to receive a common voltage from the outside. Meanwhile, the n-type semiconductor layers 21, 31, and 41 of the light emitting stacks may be connected to a first contact part 20C, a second contact part 30C, and a third contact part 40C, respectively, to receive corresponding light emitting signals via the first, second, and third connection electrodes 20ce, 30ce, and 40ce, respectively. In this manner, each of the first, second, and third light emitting stacks 20, 30, and 40 may be driven independently, while having a common p-type light emitting stacked structure.

While the light emitting chip 100 according to the illustrated exemplary embodiment has a common p-type structure, however, the inventive concepts are not limited thereto. For example, in some exemplary embodiments, the first-type semiconductor layers 21, 31, and 41 of each light emitting stack may be a p-type, and the second-type semiconductor layers 25, 35, and 45 of each light emitting stack may be an n-type to form a common n-type light emitting stacked structure. Furthermore, in some exemplary embodiments, the stacked sequence of each light emitting stack may be variously modified without being limited to that shown in the drawings. Hereinafter, the light emitting chip 100 according to the illustrated exemplary embodiment will be described with reference to the common p-type light emitting stacked structure.

According to the illustrated exemplary embodiment, the first contact part 20C includes a first pad 20pd and a first bump electrode 20bp electrically connected to the first pad 20pd. The first pad 20pd is disposed on the first upper contact electrode 21n of the first light emitting stack 20, and is connected to the first upper contact electrode 21n through a first contact hole 20CH defined through the first insulating layer 81. At least a portion of the first bump electrode 20bp may overlap with the first pad 20pd, and the first bump electrode 20bp is connected to the first pad 20pd through a first through-hole 20ct with the second insulating layer 83 interposed therebetween in an overlapping area between the first bump electrode 20bp and the first pad 20pd. In this case, the first pad 20pd and the first bump electrode 20bp may have substantially the same shape to overlap with each other, without being limited thereto.

The second contact part 30C includes a second pad 30pd and a second bump electrode 30bp electrically connected to the second pad 30pd. The second pad 30pd is disposed on the first-type semiconductor layer 31 of the second light emitting stack 30, and is connected to the first-type semiconductor layer 31 through a second contact hole 30CH defined through the first insulating layer 81. At least a portion of the second bump electrode 30bp may overlap with the second pad 30pd. The second bump electrode 30bp may be connected to the second pad 30pd through a second through hole 30ct with the second insulating layer 83 interposed therebetween in an overlapping area between the second bump electrode 30bp and the second pad 30pd.

The third contact part 40C includes a third pad 40pd and a third bump electrode 40bp electrically connected to the third pad 40pd. The third pad 40pd is disposed on the first-type semiconductor layer 41 of the third light emitting stack 40, and is connected to the first-type semiconductor layer 41 through a third contact hole 40CH defined through the first insulating layer 81. At least a portion of the third bump electrode 40bp may overlap with the third pad 40pd. The third bump electrode 40bp may be connected to the third pad 40pd through a third through hole 40ct with the second insulating layer 83 interposed therebetween in an overlapping area between the third bump electrode 40bp and the third pad 40pd.

The fourth contact part 50C includes a fourth pad 50pd and a fourth bump electrode 50bp electrically connected to the fourth pad 50pd. The fourth pad 50pd is connected to the second-type semiconductor layers 25, 35, and 45 of the first, second, and third light emitting stacks 20, 30, and 40 through a first sub-contact hole 50CHa and a second sub-contact hole 50CHb defined on the first, second, and third lower contact electrodes 25p, 35p, and 45p of the first, second, and third light emitting stacks 20, 30, and 40. In particular, the fourth pad 50pd is connected to the first lower contact electrode 25p through the second sub-contact hole 50CHb, and is connected to the second and third lower contact electrodes 35p and 45p through the first sub-contact hole 50CHa. In this manner, since the fourth pad 50pd can be connected to the second and third lower contact electrodes 35p and 45p through a single first sub-contact hole 50CHa, a manufacturing process of the light emitting chip 100 may be simplified, and an area occupied by the contact holes in the light emitting chip 100 may be reduced. At least a portion of the fourth bump electrode 50bp may overlap with the fourth pad 50pd. The fourth bump electrode 50bp is connected to the fourth pad 50pd through a fourth through hole 50ct with the second insulating layer 83 interposed therebetween in an overlapping area between the fourth bump electrode 50bp and the fourth pad 50pd.

The inventive concepts are limited to a particular structure of the contact parts 20C, 30C, 40C, and 50C. For example, in some exemplary embodiments, the bump electrode 20bp, 30bp, 40bp, or 50bp may be omitted from at least one the contact parts 20C, 30C, 40C, and 50C. In this case, the pads 20pd, 30pd, 40pd, and 50pd of the contact parts 20C, 30C, 40C, and 50C may be connected to the respective connection electrodes 20ce, 30ce, 40ce, and 50ce. In some exemplary embodiments, the bump electrode 20bp, 30bp, 40bp, and 50bp may be omitted from each of the contact parts 20C, 30C, 40C, and 50C, and the pads 20pd, 30pd, 40pd, and 50pd of the contact parts 20C, 30C, 40C, and 50C may be directly connected to the respective connection electrodes 20ce, 30ce, 40ce, and 50ce.

According to an exemplary embodiment, the first, second, third, and fourth contact parts 20C, 30C, 40C, and 50C may be formed at various locations. For example, when the light emitting chip 100 has a substantially quadrangular shape as shown in the drawings, the first, second, third, and fourth contact parts 20C, 30C, 40C, and 50C may be disposed around each corner of the substantially quadrangular shape. However, the inventive concepts are not limited thereto, and in some exemplary embodiments, the light emitting chip 100 may be formed to have various shapes, and the first, second, third, and fourth contact parts 20C, 30C, 40C, and 50C may be formed in other places depending on the shape of the light emitting device.

The first, second, third, and fourth pads 20pd, 30pd, 40pd, and 50pd are spaced apart from and insulated from each other. In addition, the first, second, third, and fourth bump electrodes 20bp, 30bp, 40bp, and 50bp are spaced apart from and insulated from each other. According to an exemplary embodiment, each of the first, second, third, and fourth bump electrodes 20bp, 30bp, 40bp, and 50bp may cover at least a portion of side surfaces of the first, second, and third light emitting stacks 20, 30, and 40, which may facilitate dissipation of heat generated from the first, second, and third light emitting stacks 20, 30, and 40 therethrough.

According to the illustrated exemplary embodiment, each of the connection electrodes 20ce, 30ce, 40ce, and 50ce may have a substantially elongated shape that protrudes away from the substrate 11. The connection electrodes 20ce, 30ce, 40ce, and 50ce may include metal, such as Cu, Ni, Ti, Sb, Zn, Mo, Co, Sn, Ag, or an alloy thereof, without being limited thereto. For example, each of the connection electrodes 20ce, 30ce, 40ce, and 50ce may include two or more metals or a plurality of different metal layers to reduce the stress applied thereto from the elongated shape of the connection electrodes 20ce, 30ce, 40ce, and 50ce. In another exemplary embodiment, when the connection electrodes 20ce, 30ce, 40ce, and 50ce include Cu, an additional metal may be deposited or plated thereon to suppress oxidation of Cu. In some exemplary embodiments, when the connection electrodes 20ce, 30ce, 40ce, and 50ce include Cu/Ni/Sn, Cu may prevent Sn from being infiltrating into the light emitting stacked structure. In some exemplary embodiments, the connection electrodes 20ce, 30ce, 40ce, and 50ce may include a seed layer for forming metal layer during a plating process, which will be described in more detail below.

As shown in the drawings, each of the connection electrodes 20ce, 30ce, 40ce, and 50ce may have a substantially flat upper surface to facilitate an electrical connection between the light emitting stacked structure with external lines or electrodes to be described later. According to an exemplary embodiment, when the light emitting chip 100 includes a micro-LED, which has a surface area less than about 10,000 square μm as known in the art, or less than about 4,000 square μm or 2,500 square μm in other exemplary embodiments, the connection electrodes 20ce, 30ce, 40ce, and 50ce may overlap a portion of at least one of the first, second, and third light emitting stacks 20, 30, and 40 as shown in the drawings. More particularly, the connection electrodes 20ce, 30ce, 40ce, and 50ce may overlap at least one step formed in a side surface of the light emitting stacked structure. In this manner, since an area of the bottom surface of a connection electrode is greater than the top surface thereof, a greater contacting area may be formed between the connection electrodes 20ce, 30ce, 40ce, and 50ce and the light emitting stacked structure. Accordingly, the connection electrodes 20ce, 30ce, 40ce, and 50ce may be more stably formed on the light emitting stacked structure. For example, one side surface of the connection electrodes 20ce, 30ce, 40ce, and 50ce L1, L2, L3, and L4 that faces the outside and the other side surface thereof L1', L2', L3', and L4' facing the center of the light emitting chip 100 may have different lengths (or heights). More particularly, the length of one side surface of a connection electrode facing the outside may be greater than that of the other surface thereof facing the center of the light emitting chip 100. For example, the difference in length between the two opposing surfaces L and L' of a connection electrode may be greater than a thickness (or height) of at one of the light emitting stacks 20, 30, and 40. In this manner, the structure of the light emitting chip 100 may be reinforced with a greater contact area between the connection electrodes 20ce, 30ce, 40ce, and 50ce and the light emitting stacked structure. In addition, since the connection electrodes 20ce, 30ce, 40ce, and 50ce may overlap at least one step formed in a side surface of the light emitting stacked structure, heat generated from the light emitting stacked structure may be more efficiently dissipated to the outside.

According to an exemplary embodiment, the different in length between one side surface of the connection electrode L1, L2, L3, or L4 facing the outside and the other surface thereof L1', L2', L3', and L4' facing the center of the light emitting chip 100 may be about 3 µm. In this case, the light emitting stacked structure may be formed to be thin, and in particular, the first light emitting stack 20 may have a thickness of about 1 µm, the second light emitting stack 30 may have a thickness of about 0.7 µm, the third light emitting stack 40 may have a thickness of about 0.7 µm, and the first and second adhesive layers may each have a thickness of about 0.2 to about 0.3 µm, without being limited thereto. According to another exemplary embodiment, the different in length between one side surface of the connection electrode L1, L2, L3, or L4 facing the outside and the other surface thereof L1', L2', L3', and L4' facing the center of the light emitting chip 100 may be about 10 to 16 µm. In this case, the light emitting stacked structure may be formed to be relatively thick and have more stable structure, and in particular, the first light emitting stack 20 may have a thickness of about 4 µm to about 5 µm, the second light emitting stack 30 may have a thickness of about 3 µm, the third light emitting stack 40 may have a thickness of about 3 µm, and the first and second adhesive layers may each have a thickness of about 3 µm, without being limited thereto. According to yet another exemplary embodiment, the different in length between one side surface of the connection electrode L1, L2, L3, or L4 facing the outside and the other surface thereof L1', L2', L3', and L4' facing the center of the light emitting chip 100 may be about 25% of the length of the longest side surface. However, the inventive concepts are not limited to a particular difference in length between the opposing surfaces of the connection electrodes, and the difference in length between the opposing surfaces of the connection electrodes may be varied.

In some exemplary embodiments, at least one of the connection electrodes 20ce, 30ce, 40ce, and 50ce may overlap a side surface of each of the light emitting stacks 20, 30, and 40, thereby balancing the temperature between each of the light emitting stacks 20, 30, and 40, and efficiently dissipate the internally generated heat to the outside. In addition, when the connection electrodes 20ce, 30ce, 40ce, and 50ce include a reflective material, such as metal, the connection electrodes 20ce, 30ce, 40ce, and 50ce may reflect light emitted from at least one or more light emitting stacks 20, 30, and 40, thereby improving light efficacy.

In general, during manufacture, an array of a plurality of light emitting chips is formed on a substrate. The substrate may then be cut along scribing lines to singularize (to separate) each light emitting chip, and the light emitting chips may be transferred to another substrate or tape using various transferring technologies for further processing of the light emitting chips, such as packaging. In this case, when the light emitting chip includes connection electrodes, such as metal bumps or pillars that protrude outwardly from the light emitting structure, various problems may occur during subsequent processes, such as in the steps of transfer, due to the structure of the bare light emitting chip exposing the connection electrodes to the outside. Moreover, when the light emitting chips include a micro-LED, which has a surface area less than about 10,000 square µm, or less than about 4,000 square µm, or less than about 2,500 square µm, depending upon applications, handling of the light emitting chips may become more difficult due to its small form factor.

For example, when the connection electrodes have a substantially elongated shape, such as a bar, transferring the light emitting chips using a conventional vacuum method becomes difficult as the light emitting chip may not have sufficient suction area due to the protruding structure of the connection electrodes. Furthermore, the exposed connection electrodes may be directly impacted with various stresses during subsequent processes, such as when the connection electrodes contact a manufacturing device, which may cause damage to the structure of the light emitting chip. As another example, when the light emitting chips are transferred by attaching an adhesive tape on a top surface of the light emitting chips (e.g., a surface opposing the substrate), the contacting area between the light emitting chips and the adhesive tape may be limited to top surfaces of the connecting electrodes. In this case, the adhesion of the light emitting chip to the adhesion tape may become weak, as opposed to when the adhesion tape is attached to a bottom surface of the chip (e.g., substrate), and the light emitting chips may be undesirably detached from the adhesive tape while being transferred. As another example, when the light emitting chip is transferred using a conventional pick-and-place method, an ejection pin may directly contact a portion of the light emitting chip disposed between the connection electrodes, and damage a top structure of the light emitting structure. In particular, the ejection pin may strike a center of the light emitting chip, and cause physical damage to the top light emitting stack of the light emitting chip. Such impact by the ejection pin to the light emitting chip is shown in FIG. 1E, where the center of the light emitting chip 100 is indented by the ejection pin.

According to an exemplary embodiment, the passivation layer 90 may be formed on the light emitting stacked structure. More particularly, as shown in FIG. 1A, the passivation layer 90 may be formed between the connection electrodes 20ce, 30ce, 40ce, and 50ce, and cover at least the sides of the light emitting stacked structure. According to the illustrated exemplary embodiment, the passivation layer 90 may expose side surfaces of the substrate 11, first and second insulating layers 81 and 83, and the third light emitting stack 40. The passivation layer 90 may be formed to be substantially flush with top surfaces of the connection electrodes 20ce, 30ce, 40ce, and 50ce, and may include an epoxy molding compound (EMC), which may be formed to various colors, such as black or transparent. However, the inventive concepts are not limited thereto. For example, in some exemplary embodiments, the passivation layer 90 may include a polyimide (PID), and in this case, the PID may be provided as a dry film rather than a liquid type to increase the level of flatness when applied to the light emitting stacked structure. In some exemplary embodiments, the passivation layer 90 may include a material that has photosensitivity. In this manner, the passivation layer 90 may protect the light emitting structure from an external impact that may be applied during subsequent processes, as well as providing a sufficient contact area to the light emitting chip 100 to facilitate its handling during subsequent transferring steps. In addition, the passivation layer 90 may prevent leakage of light towards a side surface of the light emitting chip 100, so as to prevent or at least suppress interference of light emitted from adjacent light emitting chips 100.

Figure 2:
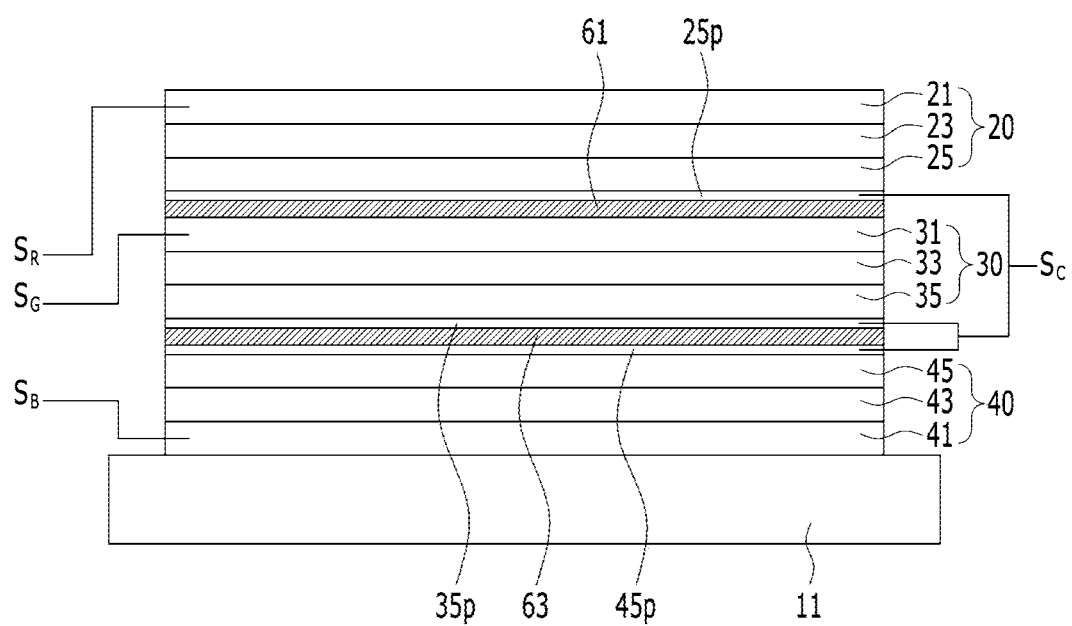
FIG. 2 is a schematic cross-sectional view of a light emitting stacked structure constructed according to an exemplary embodiment.

FIG. 2 is a schematic cross-sectional view of a light emitting stacked structure according to an exemplary embodiment. The light emitting stacked structure according to the illustrated exemplary embodiment is substantially the same as that included in the light emitting chip 100 described above, and thus, repeated descriptions of substantially the same elements forming the light emitting stacked structure will be omitted to avoid redundancy.

Referring to FIG. 2, the first, second, and third lower contact electrodes 25*p*, 35*p*, and 45*p* according to an exemplary embodiment may be connected to a common line, to which is the common voltage Sc is applied. Light emitting signal lines $S_R$, $S_G$, and $S_B$ may be respectively connected to the first-type semiconductor layers 21, 31, and 41 of the first, second, and third light emitting stacks 20, 30, and 40. In this case, the light emitting signal line is connected to the first-type semiconductor layer 21 of the first light emitting stack 20 through the first upper contact electrode 21*n*. In the illustrated exemplary embodiment, a common voltage Sc is applied to the first, second, and third lower contact electrodes 25*p*, 35*p*, and 45*p* through the common line, and the light emitting signal is respectively applied to the first-type semiconductor layers 21, 31, and 41 of the first, second, and third light emitting stacks 20, 30, and 40 through the light emitting signal lines. In this manner, the first, second, and third light emitting stacks 20, 30, and 40 may be individually controlled to selectively emit light.

Although FIG. 2 shows the light emitting stacked structure having the p-common structure, however, the inventive concepts are not limited thereto. For example, in some exemplary embodiments, the common voltage Sc may be applied to the first-type (or n-type) semiconductor layers 21, 31, and 41 of the first, second, and third light emitting stacks 20, 30, and 40, and the light emitting signal may be applied to the second-type (or p-type) semiconductor layers 25, 35, and 45 of the first, second, and third light emitting stacks 20, 30, and 40.

The light emitting stacked structure according to an exemplary embodiment may display various colors of light depending on the operating status of each light emitting stack 20, 30, and 40, whereas a conventional light emitting device may display various colors by a combination of multiple light emitting cells emitting a single color of light. More particularly, a conventional light emitting device generally includes light emitting cells that respectively emit different color of light, e.g., red, green, and blue, which are spaced apart from each other along a two dimensional plane, to implement a full color display. As such, a relatively large area may be occupied by the conventional light emitting cells. The light emitting stacked structure according to an exemplary embodiment, however, can emit different color of light by stacking a plurality of light emitting stacks 20, 30, 40, thereby providing a high level of integration and implementing the full color through a significantly smaller area than that in the conventional light emitting device.

In addition, when the light emitting chips 100 are mounted to another substrate to manufacture a display device, for example, the number of chips to be mounted may be significantly reduced as compared to the conventional light emitting devices due to its stacked structure. As such, a manufacture of the display device that employs the light emitting chip 100 may be substantially simplified, especially when hundreds of thousands or millions of pixels are formed in one display device.

According to an exemplary embodiment, the light emitting stacked structure may further include various additional components to improve the purity and efficiency of light emitted therefrom. For example, in some exemplary embodiments, a wavelength pass filter may be formed between adjacent light emitting stacks to prevent or at least suppress light having a shorter wavelength from traveling towards a light emitting stack emitting a longer wavelength. In addition, in some exemplary embodiments, concave-convex portions may be formed on a light emitting surface of at least one of the light emitting stacks to balance the brightness of light between the light emitting stacks. For example, as green light generally has a higher visibility than red light and blue light, in some exemplary embodiments, the concave-convex portions may be formed on the light emitting stacks emitting red light or blue light to improve light efficiency thereof, thereby balancing the visibility between light emitted from the light emitting stacks.

Hereinafter, a method of forming the light emitting chip 100 will be described with reference to the drawings according to an exemplary embodiment.

FIGS. 3A, 4A, 5A, 6A, 7A, and 8A are plan views illustrating a process of manufacturing the light emitting chip of FIG. 1A according to an exemplary embodiment. FIGS. 3B, 4B, 5B, 6B, 7B, and 8B are cross-sectional views taken along line A-A' of its corresponding plan view shown in FIGS. 3A, 4A, 5A, 6A, 7A, and 8A according to an exemplary embodiment. FIG. 9 is a schematic cross-sectional view of the light emitting chip of FIG. 1A according to an exemplary embodiment. FIGS. 10, 11, 12, and 13 are cross-sectional views schematically illustrating a process of manufacturing the light emitting chip of FIG. 1A according to an exemplary embodiment.

Referring back to FIG. 2, the first-type semiconductor layer 41, the third active layer 43, and the second-type semiconductor layer 45 of the third light emitting stack 40 may be sequentially grown on the substrate 11 by a metal organic chemical vapor deposition (MOCVD) method or a molecular beam epitaxy (MBE) method, for example. The third lower contact electrode 45*p* may be formed on the third p-type semiconductor layer 45 by a physical vapor deposition method or a chemical vapor deposition method, for example, and may include a transparent conductive oxide (TCO), such as tin oxide (SnO), indium oxide ($InO_2$), zinc oxide (ZnO), indium tin oxide (ITO), indium tin zinc oxide (ITZO) or the like. When the third light emitting stack 40 emits blue light according to an exemplary embodiment, the substrate 11 may include $Al_2O_3$ (e.g., sapphire substrate), and the third lower contact electrode 45*p* may include a transparent conductive oxide (TCO), such as tin oxide (SnO), indium oxide ($InO_2$), zinc oxide (ZnO), indium tin oxide (ITO), indium tin zinc oxide (ITZO) or the like. The first and second light emitting stacks 20 and 30 may be similarly formed by sequentially growing the first-type semiconductor layer, the active layer, and the second-type semiconductor layer on a temporary substrate, respectively, and the lower contact electrode including a transparent conductive oxide (TCO) may be respectively formed on the second-type semiconductor layer by a chemical vapor deposition method or the like, for example.

According to an exemplary embodiment, the first and second light emitting stacks 20 and 30 may be adjoined to each other with the first adhesive layer 61 interposed therebetween, and at least one of the temporary substrates of the first and second light emitting stacks 20 and 30 may be removed by a laser lift off process, chemical process, mechanical process, or the like, for example. In this case, in some exemplary embodiments, concave-convex portions may be formed on the exposed light emitting stack to improve light extraction efficiency. Then, the first and second light emitting stacks 20 and 30 may be adjoined with the third light emitting stack 40 with the second adhesive layer 63 interposed therebetween, and the remaining one of the temporary substrates of the first and second light emitting stacks 20 and 30 may be removed by a laser lift off process, chemical process, mechanical process, or the like, for example. In this case, in some exemplary embodiments, concave-convex portions may be formed on the remaining exposed light emitting stack to improve light extraction efficiency. In this manner, the light emitting stacked structure shown in FIG. 2 may be formed.

In another exemplary embodiment, the second adhesive layer 63 may be formed on the third light emitting stack 40. Then, the second light emitting stack 30 may be adjoined to the third light emitting stack 40 with the second adhesive layer 63 interposed between, and the temporary substrate of the second light emitting stack 30 may be removed by a laser lift off process, chemical process, mechanical process, or the like. Then, the first adhesive layer 61 may be formed on the second light emitting stack 30. The first light emitting stack 20 may then be adjoined to the second light emitting stack 30 with the first adhesive layer 61 interposed therebetween. Once the first light emitting stack 20 is coupled to the second light emitting stack 30 that is coupled to the third light emitting stack 40, the temporary substrate of the first light emitting stack 20 may be removed by a laser lift off process, chemical process, mechanical process, or the like. In some exemplary embodiments, concave-convex portions may be formed on one or more surfaces of one light emitting stack before or after being coupled to another light emitting stack to improve light extraction efficiency.

Figure 3A:
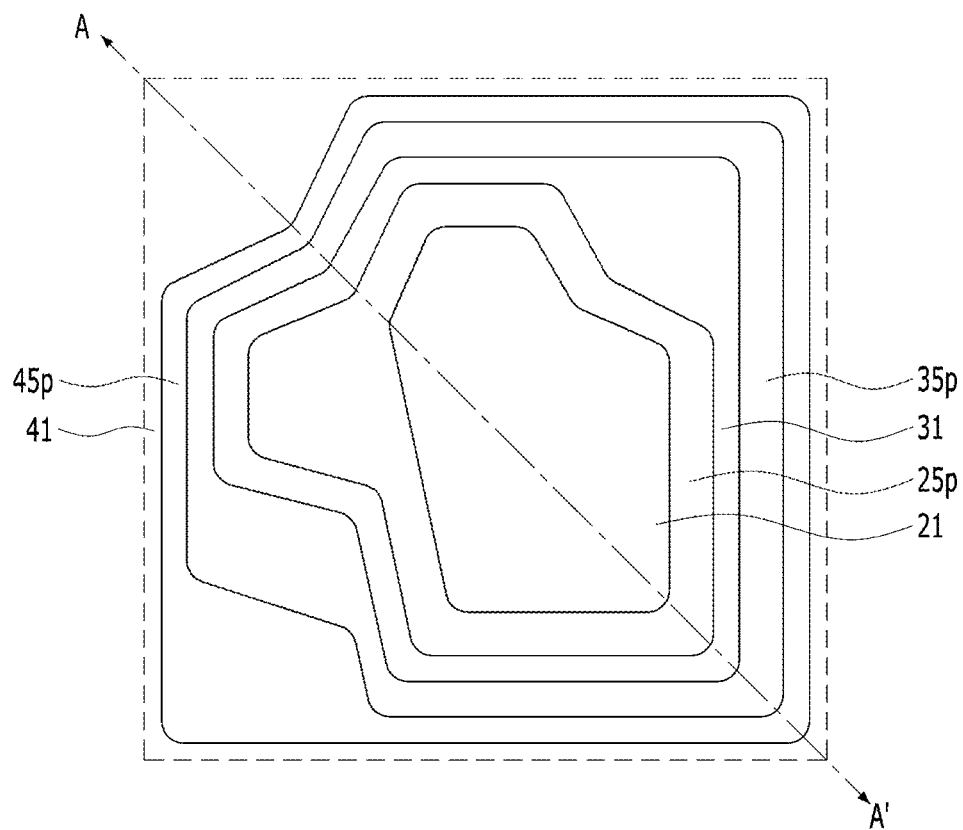
FIGS. 3A, 4A, 5A, 6A, 7A, and 8A are plan views illustrating a process of manufacturing the light emitting chip of FIG. 1A according to an exemplary embodiment.
Figure 3B:
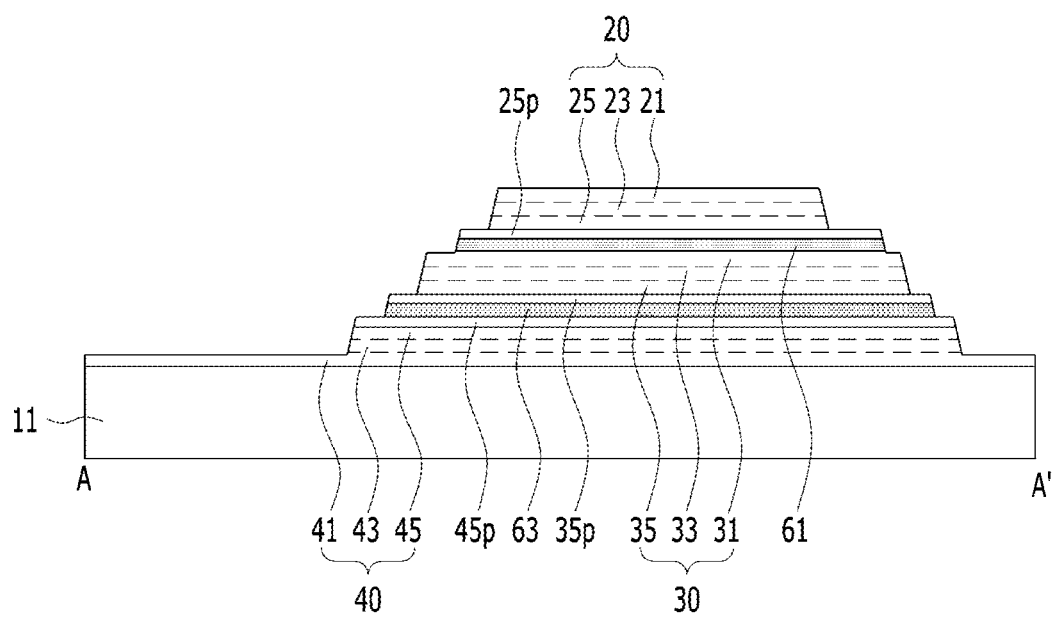
FIGS. 3B, 4B, 5B, 6B, 7B, and 8B are cross-sectional views taken along line A-A' of its corresponding plan view shown in FIGS. 3A, 4A, 5A, 6A, 7A, and 8A according to an exemplary embodiment.

Referring to FIGS. 3A and 3B, various portions of each of the first, second, and third light emitting stacks 20, 30, and 40 may be patterned via etching process or the like to expose portions of the first-type semiconductor layer 21, first lower contact electrode 25p, first-type semiconductor layer 31, second lower contact electrode 35p, third lower contact electrode 45p, and first-type semiconductor layer 41. According to the illustrated exemplary embodiment, the first light emitting stack 20 has the smallest area among the light emitting stacks 20, 30, and 40. However, the inventive concepts are not limited to relative sizes of the light emitting stacks 20, 30, and 40.

Figure 4A:
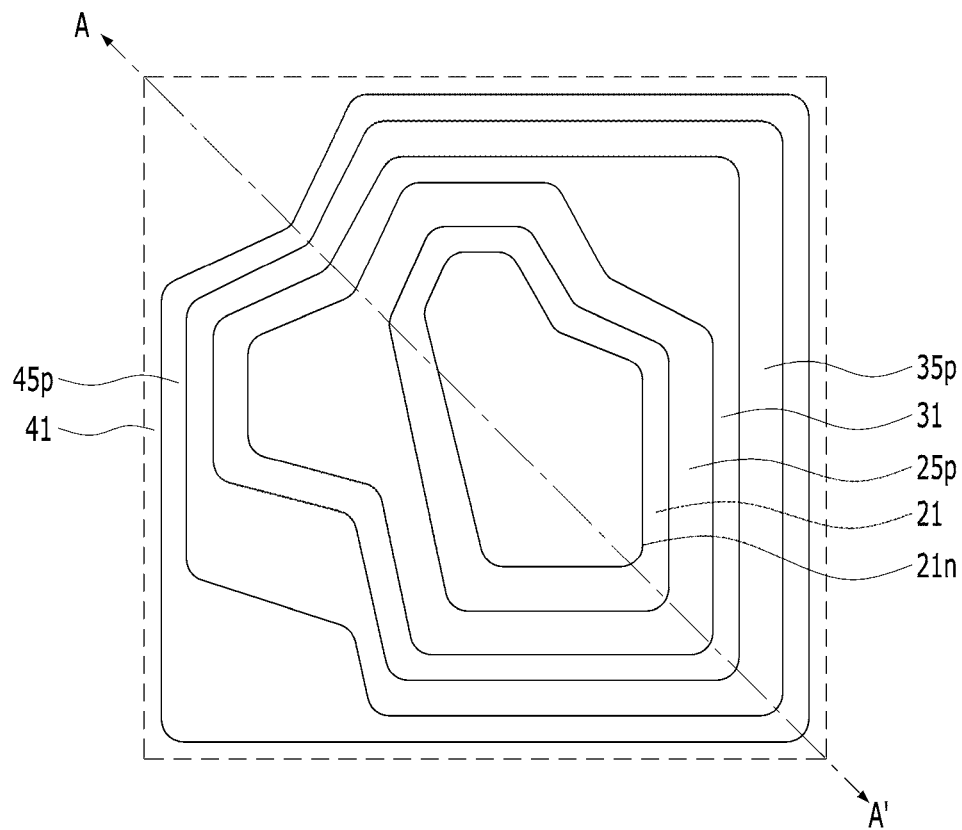
Figure 4B:
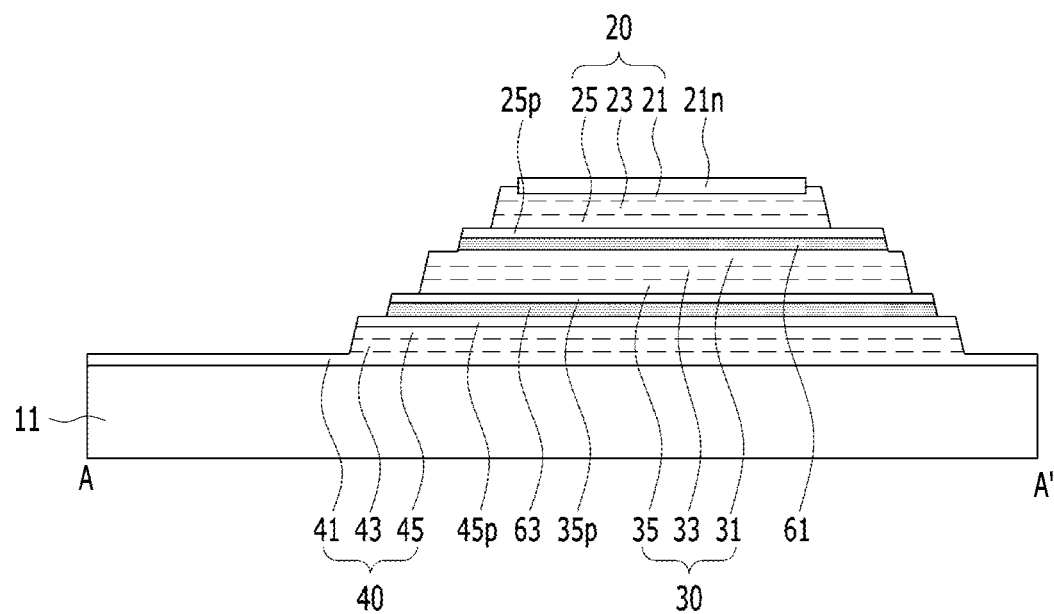

Referring to FIGS. 4A and 4B, a portion of a top surface of the first-type semiconductor layer 21 of the first light emitting stack 20 may be patterned, such as via wet-etching, at which the first upper contact electrode 21n may be formed. As described above, the first upper contact electrode 21n may be formed in the patterned area of the first-type semiconductor layer 21 with a thickness of about 100 nm, for example, to improve ohmic contact therebetween.

Figure 5A:
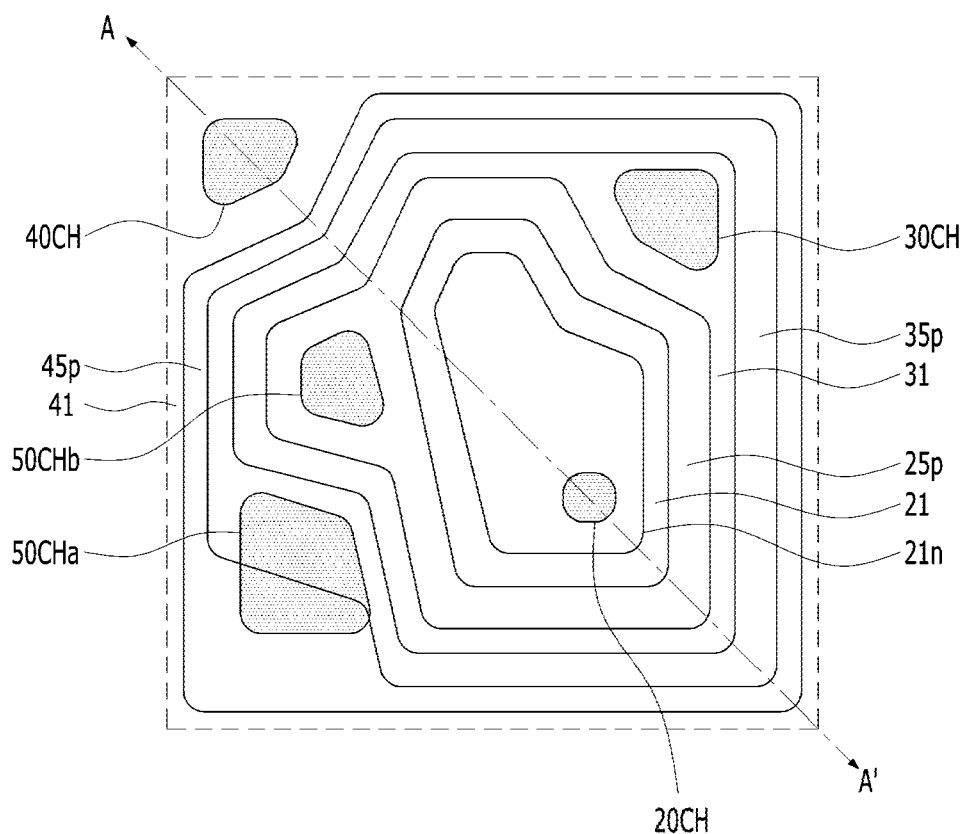
Figure 5B:
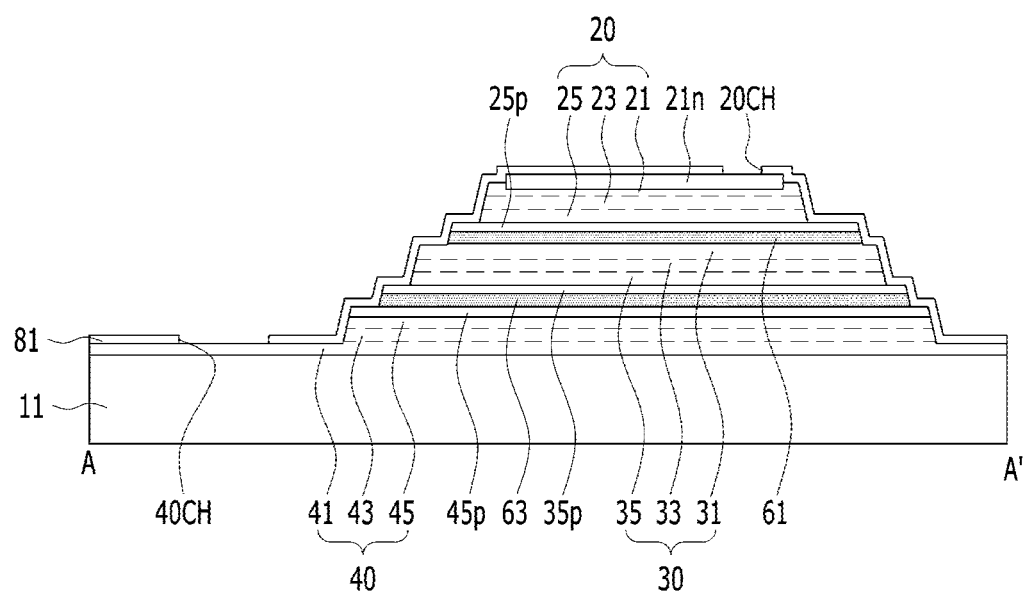

Referring to FIGS. 5A and 5B, the first insulating layer 81 may be formed to cover the light emitting stacks 20, 30, and 40, and portions of the first insulating layer 81 may be removed to form the first, second, third, and fourth contact holes 20CH, 30CH, 40CH, and 50CH. The first contact hole 20CH is defined on the first n-type contact electrode 21n to expose a portion of the first n-type contact electrode 21n.

The second contact hole 30CH may expose a portion of the first-type semiconductor layer 31 of the second light emitting stack 30. The third contact hole 40CH may expose a portion of the first-type semiconductor layer 41 of the third light emitting stack 40. The fourth contact hole 50CH may expose portions of the first, second, and third lower contact electrodes 21p, 31p, and 41p. The fourth contact hole 50CH may include the first sub-contact hole 50CHa exposing a portion of the first lower contact electrode 25p and the second sub-contact hole 50CHb exposing the second and third lower contact electrodes 35p and 45p. In some exemplary embodiments, however, a single first sub-contact hole CH may expose each of the first, second, and third lower contact electrodes 21p, 31p, and 41p.

Figure 6A:
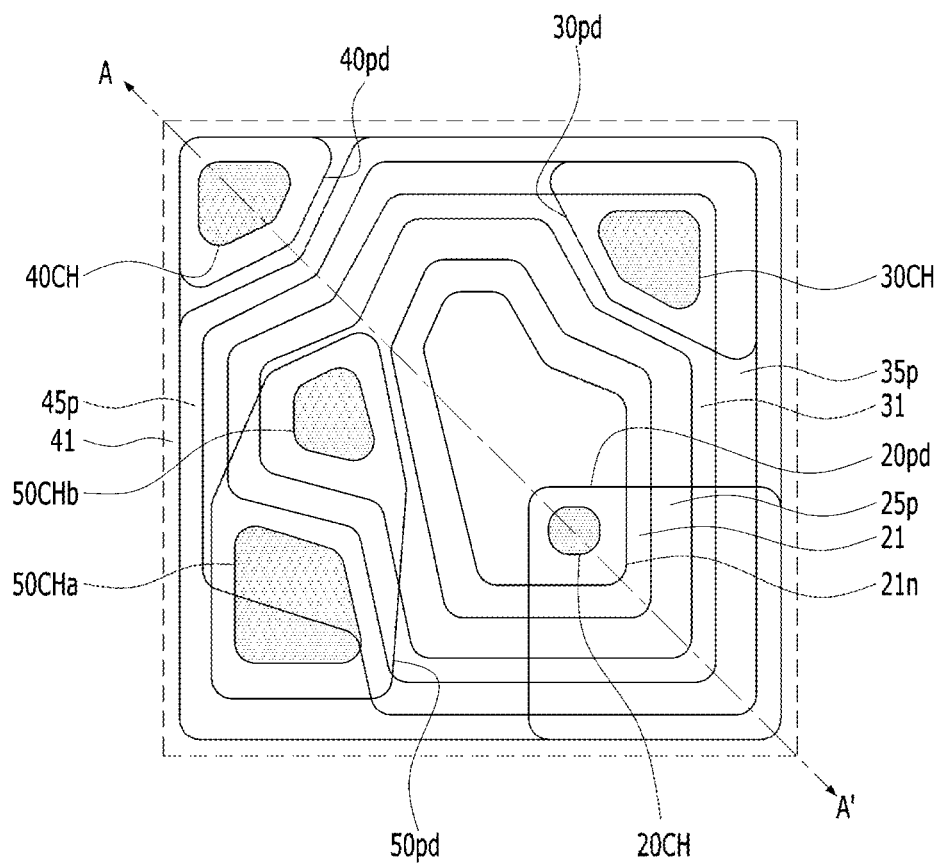
Figure 6B:
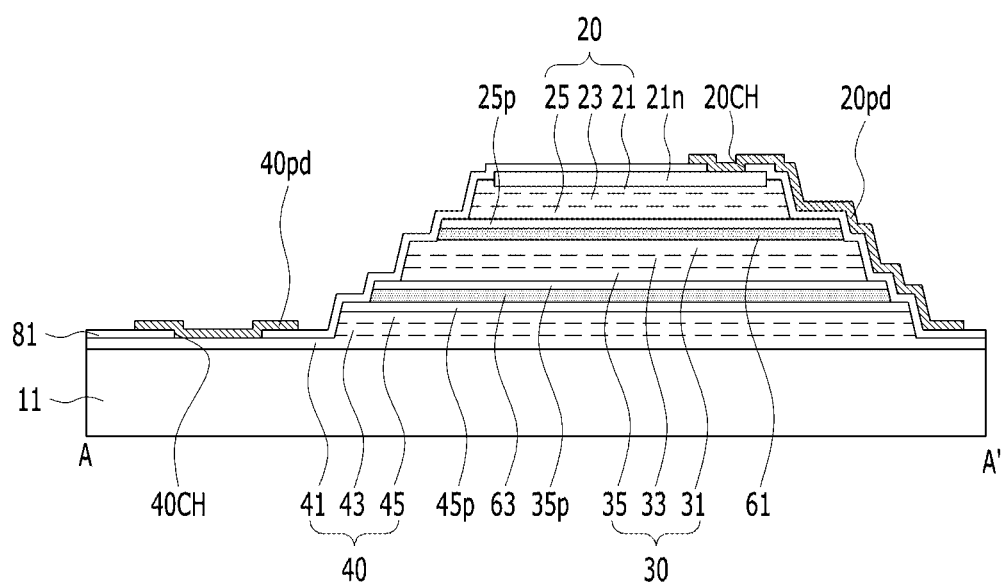

Referring to FIGS. 6A and 6B, the first, second, third, and fourth pads 20pd, 30pd, 40pd, and 50pd are formed on the first insulating layer 81 formed with the first, second, third, and fourth contact holes 20CH, 30CH, 40CH, and 50CH. The first, second, third, and fourth pads 20pd, 30pd, 40pd, and 50pd may be formed by, for example, forming a conductive layer on substantially the entire surface of the substrate 11, and patterning the conductive layer using a photolithography process or the like.

The first pad 20pd is formed to overlap an area where the first contact hole 20CH is formed, such that the first pad 20pd may be connected to the first upper contact electrode 21n of the first light emitting stack 20 through the first contact hole 20CH. The second pad 30pd is formed to overlap an area where the second contact hole 30CH is formed, such that the second pad 30pd may be connected to the first-type semiconductor layer 31 of the second light emitting stack 30 through the second contact hole 30CH. The third pad 40pd is formed to overlap an area where the third contact hole 40CH is formed, such that the third pad 40pd may be connected to the first-type semiconductor layer 41 of the third light emitting stack 40 through the third contact hole 40CH. The fourth pad 50pd is formed to overlap with an area where the fourth contact hole 50CH is formed, more particularly, where the first and second sub-contact holes 50CHa and 50CHb are formed, such that the fourth pad 50pd may be connected to the first, second, and third lower contact electrodes 25p, 35p, and 45p of the first, second, and third light emitting stacks 20, 30, and 40 through the first and second sub-contact holes 50CHa and 50CHb.

Figure 7A:
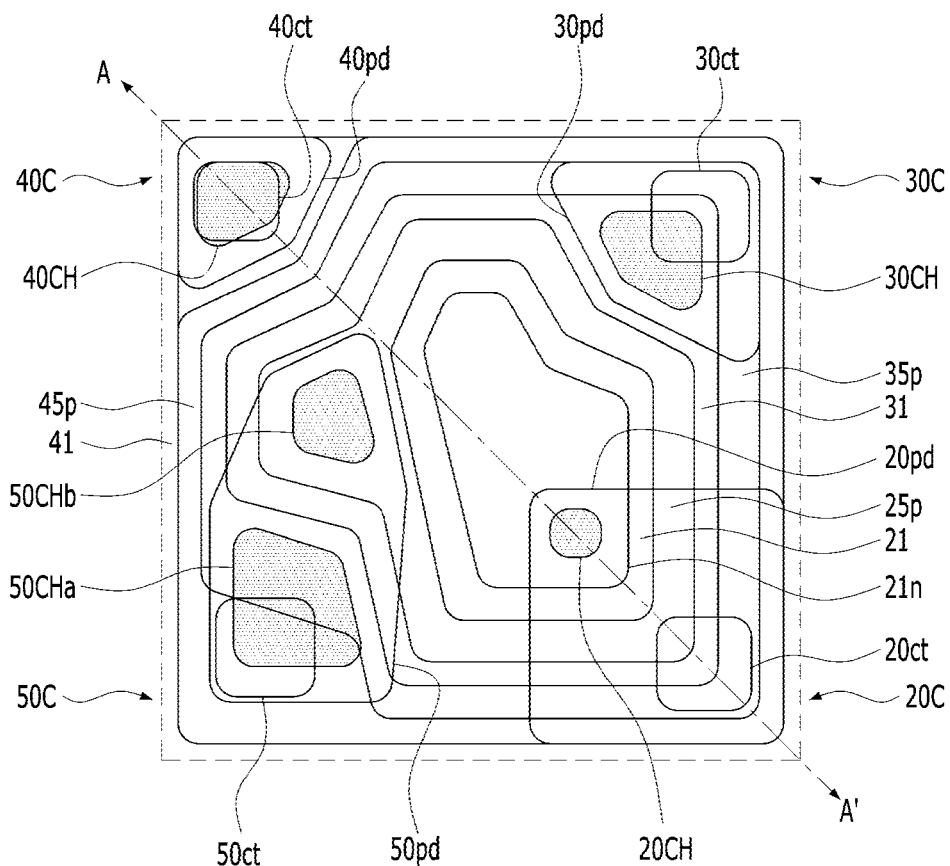
Figure 7B:
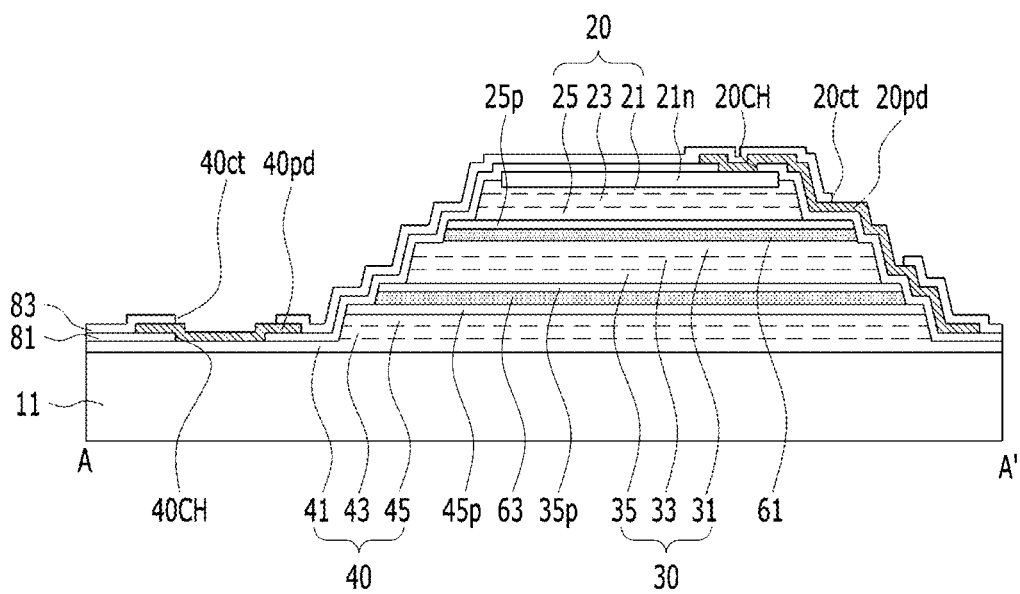

Referring to FIGS. 7A and 7B, the second insulating layer 83 may be formed on the first insulating layer 81. The second insulating layer 83 may include silicon oxide and/or silicon nitride. However, the inventive concepts are not limited thereto, and in some exemplary embodiments, the first and second insulating layers 81 and 83 may include an inorganic material. The second insulating layer 83 is then patterned and to form the first, second, third, and fourth through holes 20ct, 30ct, 40ct, and 50ct therein.

The first through hole 20ct formed on the first pad 20pd exposes a portion of the first pad 20pd. The second through hole 30ct formed on the second pad 30pd exposes a portion of the second pad 30pd. The third through hole 40ct formed on the third pad 40pd exposes a portion of the third pad 40pd. The fourth through hole 50ct formed on the fourth pad 50pd exposes a portion of the fourth pad 50pd. In the illustrated exemplary embodiment, the first, second, third, and fourth through holes 20ct, 30ct, 40ct, and 50ct may be respectively defined in areas where the first, second, third, and fourth pads 20pd, 30pd, 40pd, and 50pd are formed.

Figure 8A:
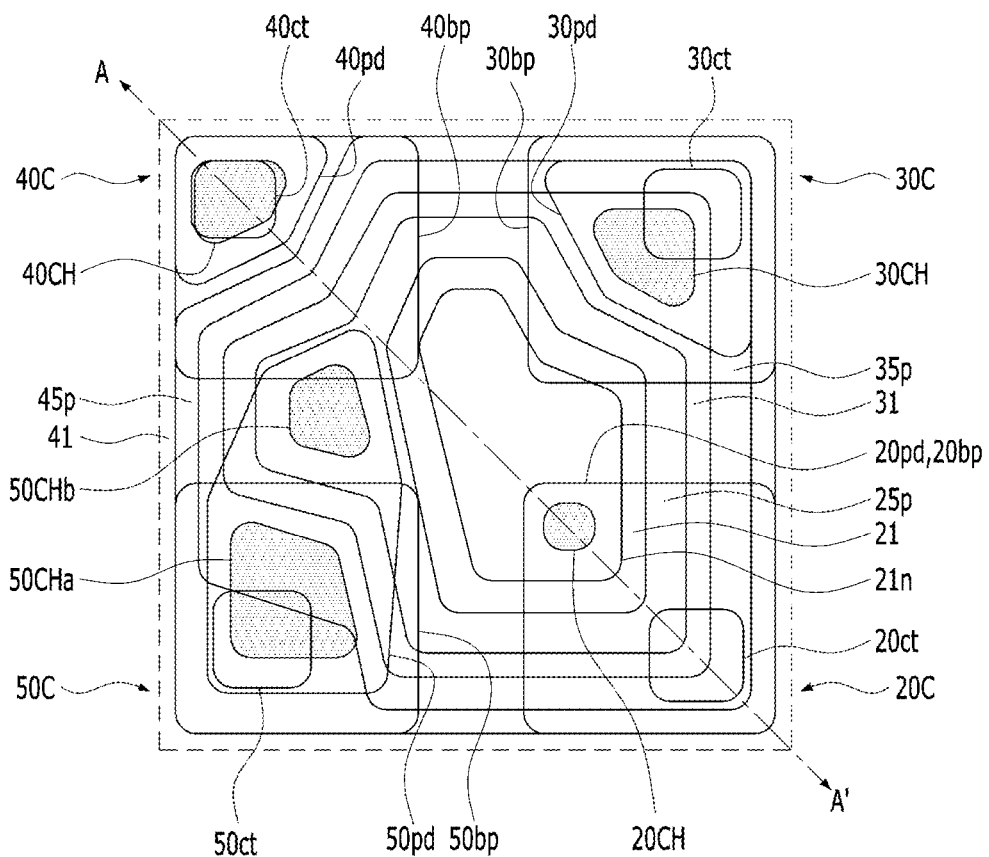
Figure 8B:
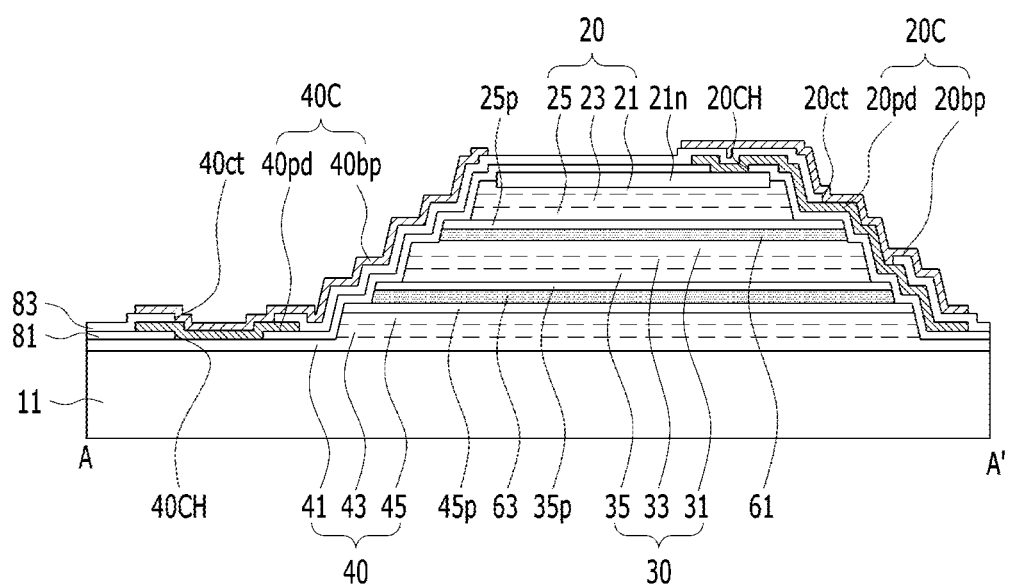
Figure 9:
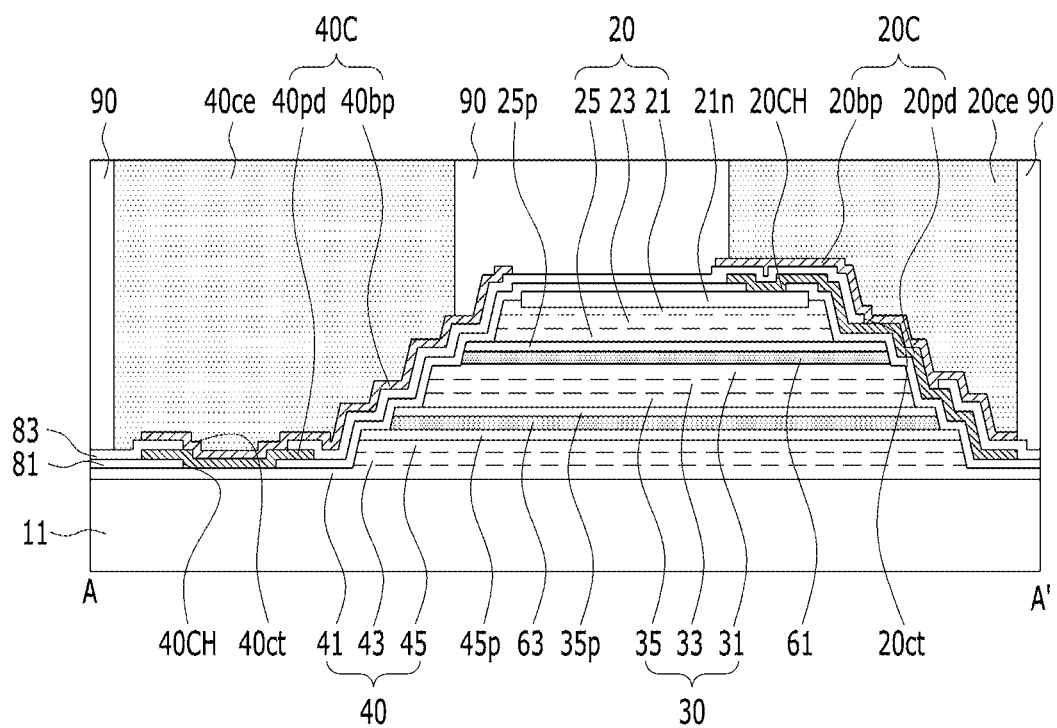
FIG. 9 is a schematic cross-sectional view of the light emitting chip of FIG. 1A according to an exemplary embodiment.

Referring to FIGS. 8A and 8B, the first, second, third, and fourth bump electrodes 20bp, 30bp, 40bp, and 50bp are formed on the second insulating layer 83 formed with the first, second, third, and fourth through holes 20ct, 30ct, 40ct, and 50ct. The first bump electrode 20bp is formed to overlap an area where the first through hole 20ct is formed, such that the first bump electrode 20bp may be connected to the first pad 20pd through the first through hole 20ct. The second bump electrode 30bp is formed to overlap an area where the second through hole 30ct is formed, such that the second bump electrode 30bp may be connected to the second pad 30pd through the second through hole 30ct. The third bump electrode 40bp is formed to overlap an area where the third through hole 40ct is formed, such that the third bump electrode 40*bp* may be connected to the third pad 40*pd* through the third through hole 40*ct*. The fourth bump electrode 50*bp* is formed to overlap with an area where the fourth through hole 50*ct* is formed, such that the fourth bump electrode 50*bp* is connected to the fourth pad 50*pd* through the fourth through hole 50*ct*. The first, second, third, and fourth bump electrodes 20*bp*, 30*bp*, 40*bp*, and 50*bp* may be formed by depositing a conductive layer on the substrate 11, and patterning the conductive layer, for example, which may include at least one of Ni, Ag, Au, Pt, Ti, Al, Cr, Wi, TiW, Mo, Cu, TiCu, or the like.

Referring back to FIGS. 1B to 1D, the first, second, third, and fourth connection electrodes 20*ce*, 30*ce*, 40*ce*, and 50*ce* spaced apart from each other are formed on the light emitting stacked structure. The first, second, third, and fourth connection electrodes 20*ce*, 30*ce*, 40*ce*, and 50*ce* may be electrically connected to the first, second, third, and fourth bump electrodes 20*bp*, 30*bp*, 40*bp*, and 50*bp*, respectively, to transmit an external signal to each of the light emitting stacks 20, 30, and 40. More particularly, according to the illustrated exemplary embodiment, the first connection electrode 20*ce* may be connected to the first bump electrode 20*bp*, which is connected to the first upper contact electrode 21*n* through the first pad 20*pd*, to be electrically connected to the first-type semiconductor layer 21 of the first light emitting stack 20. The second connection electrode 30*ce* may be connected to the second bump electrode 30*bp*, which is connected to the second pad 30*pd*, to be electrically connected to the first-type semiconductor layer 31 of the second light emitting stack 30. The third connection electrode 40*ce* may be connected to the third bump electrode 40*bp*, which is connected to the third pad 40*pd*, to be electrically connected to the first-type semiconductor layer 41 of the third light emitting stack 40. The fourth connection electrode 50*ce* may be connected to the fourth bump electrode 50*bp*, which is connected to the fourth pad 50*pd*, to be electrically connected to the second-type semiconductor layers 25, 35, and 45 of the light emitting stacks 20, 30, and 40 via the first, second, and third lower contact electrodes 25*p*, 35*p*, and 45*p*, respectively.

A method of forming the first, second, third, and fourth connection electrodes 20*ce*, 30*ce*, 40*ce*, and 50*ce* is not particularly limited. For example, according to an exemplary embodiment, a seed layer may be deposited on the light emitting stacked structure as a conductive surface, and the seed layer may be patterned by using a photo-lithography or the like, such that the seed layer is disposed at desired locations where the connection electrodes are to be formed. According to an exemplary embodiment, the seed layer may be deposited to have a thickness of about 1000 Å, without being limited thereto. Then, the seed layer may be plated with metal, such as Cu, Ni, Ti, Sb, Zn, Mo, Co, Sn, Ag, or an alloy thereof, and the seed layer may be removed. In some exemplary embodiments, an additional metal may be deposited or plated on the plated metal (e.g., the connection electrodes), by an electroless nickel immersion gold (ENIG) or the like, to prevent or at least suppress oxidation of the plated metal. In some exemplary embodiments, the seed layer may remain in each connection electrode.

According to an exemplary embodiment, when the bump electrodes 20*bp*, 30*bp*, 40*bp*, and 50*bp* are omitted from the contact parts 20C, 30C, 40C, and 50C, the pads 20*pd*, 30*pd*, 40*pd*, and 50*pd* may be connected to the respective connection electrodes 20*ce*, 30*ce*, 40*ce*, and 50*ce*. For example, after the through-holes 20*ct*, 30*ct*, 40*ct*, and 50*ct* are formed to partially expose the pads 20*pd*, 30*pd*, 40*pd*, and 50*pd* of the contact parts 20C, 30C, 40C, and 50C, a seed layer may be deposited on the light emitting stacked structure as a conductive surface, and the seed layer may be patterned by using a photo-lithography or the like, such that the seed layer is disposed at desired locations where the connection electrodes are to be formed. In this case, the seed layer may overlap at least a portion of each pad 20*pd*, 30*pd*, 40*pd*, and 50*pd*. According to an exemplary embodiment, the seed layer may be deposited to a thickness of about 1000 Å, without being limited thereto Then, the seed layer may be plated with metal, such as Cu, Ni, Ti, Sb, Zn, Mo, Co, Sn, Ag, or an alloy thereof, and the seed layer may be removed. In some exemplary embodiments, an additional metal may be deposited or plated on the plated metal (e.g., the connection electrodes), by an electroless nickel immersion gold (ENIG) or the like, to prevent or at least suppress oxidation of the plated metal. In some exemplary embodiments, the seed layer may remain in each connection electrode.

According to the illustrated exemplary embodiment, each of the connection electrodes 20*ce*, 30*ce*, 40*ce*, and 50*ce* may have a substantially elongated shape that projects away from the substrate 11. In another exemplary embodiment, the connection electrodes 20*ce*, 30*ce*, 40*ce*, and 50*ce* may include two or more metals or a plurality of different metal layers to reduce the stress applied thereto from the elongated shape of the connection electrodes 20*ce*, 30*ce*, 40*ce*, and 50*ce*. However, the inventive concepts are not limited to a particular shape of the connection electrodes 20*ce*, 30*ce*, 40*ce*, and 50*ce*, and in some exemplary embodiments, the connection electrodes may have various shapes.

As shown in the drawings, each of the connection electrodes 20*ce*, 30*ce*, 40*ce*, and 50*ce* may have a substantially flat upper surface to facilitate an electrical connection between the light emitting stacked structure and external lines or electrodes. The connection electrodes 20*ce*, 30*ce*, 40*ce*, and 50*ce* may overlap at least one step formed in a side surface of the light emitting stacked structure. In this manner, the bottom surface of the connection electrode may have a greater width than the upper surface thereof, and provides a greater contacting area between the connection electrodes 20*ce*, 30*ce*, 40*ce*, and 50*ce* and the light emitting stacked structure, such that the light emitting chip 100 has a more stable structure that can withstand various subsequent processes along with the passivation layer 90. In this case, one side surface L of the connection electrodes 20*ce*, 30*ce*, 40*ce*, and 50*ce* that faces the outside and the other side surface thereof L' facing the center of the light emitting chip 100 may have different lengths. For example, the difference in length between the two opposing surfaces of a connection electrode may be in a range of about 3 μm to about 16 μm, without being limited thereto.

Then, the passivation layer 90 is disposed between the connection electrodes 20*ce*, 30*ce*, 40*ce*, and 50*ce*. The passivation layer 90 may be formed to be substantially flush with top surfaces of the connection electrodes 20*ce*, 30*ce*, 40*ce*, and 50*ce* by a polishing process or the like. According to an exemplary embodiment, the passivation layer 90 may include a black epoxy molding compound (EMC), without being limited thereto. For example, in some exemplary embodiments, the passivation layer 90 may include a polyimide dry film (PID) that has photosensitivity. In this manner, the passivation layer 90 may protect the light emitting structure from an external impact that may be applied during subsequent processes, as well as providing a sufficient contact area to the light emitting chip 100 to facilitate its handling during subsequent transferring steps. In addition, the passivation layer 90 may prevent leakage of light towards a side surface of the light emitting chip 100, so as to prevent or at least suppress interference of light emitted from adjacent light emitting chips 100.

Figure 10:
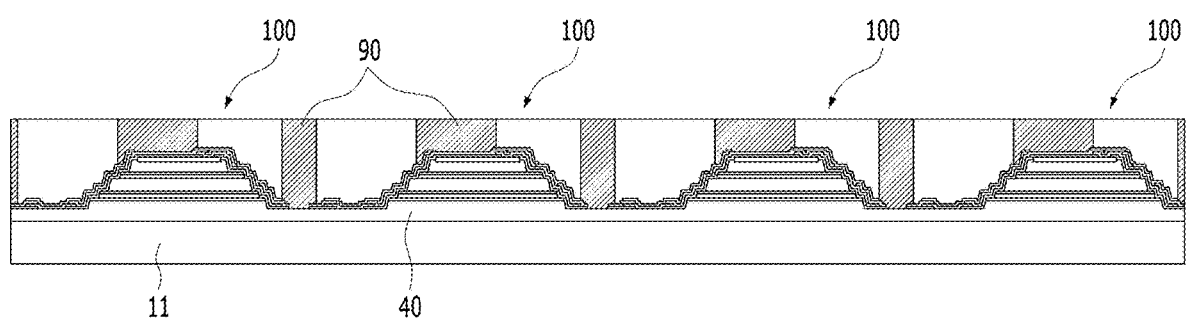
FIGS. 10, 11, 12, and 13 are cross-sectional views schematically illustrating a process of manufacturing the light emitting chip of FIG. 1A according to an exemplary embodiment.
Figure 11:
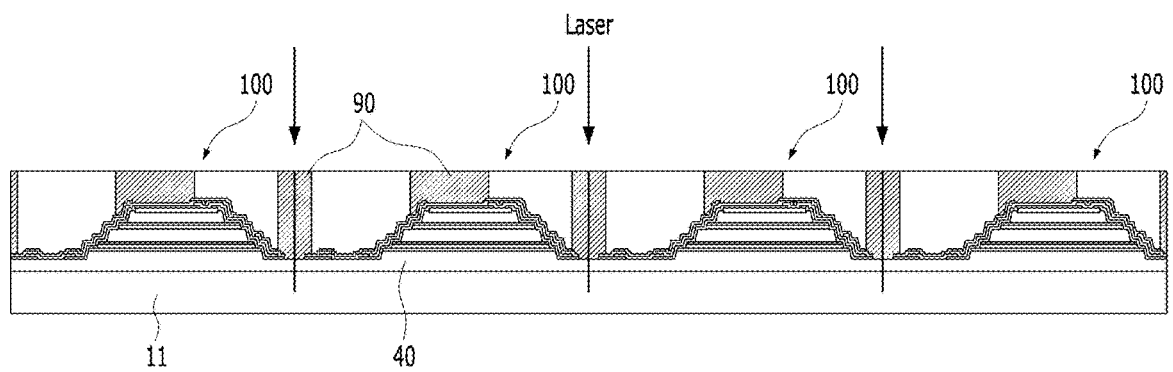
Figure 12:
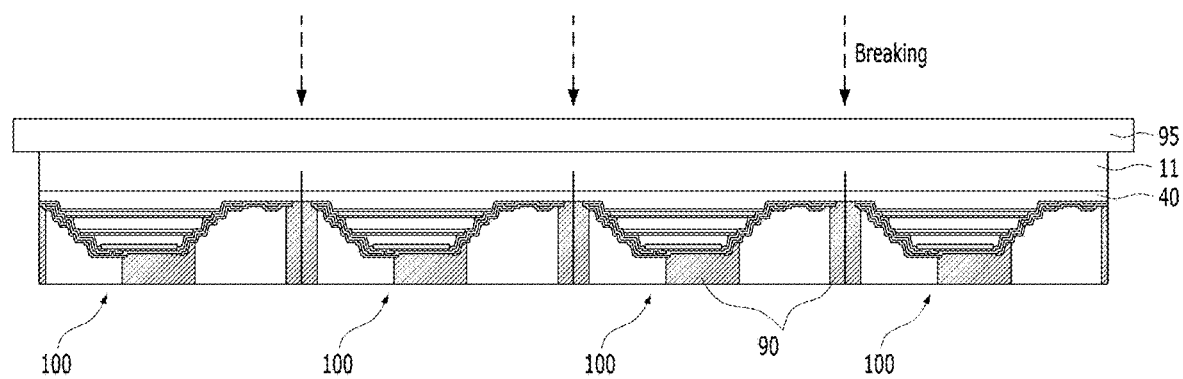
Figure 13:
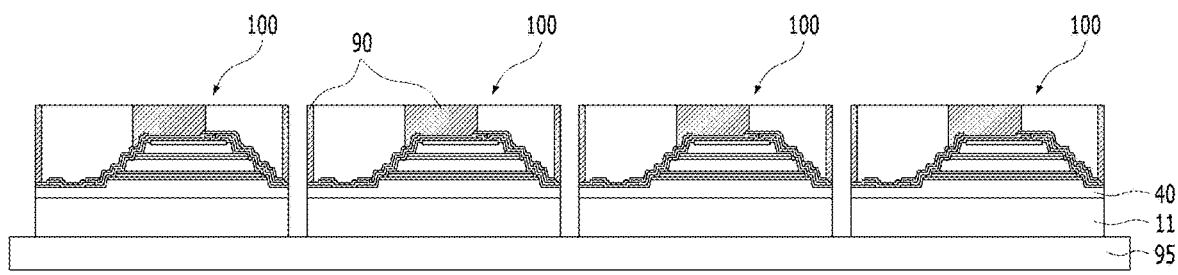

FIG. 10 exemplarily illustrates a plurality of light emitting chips 100 disposed on the substrate 11, which is subject to a singularization process to separate each of the light emitting chips 100. Referring to FIG. 11, according to an exemplary embodiment, laser beams Laser may be radiated between the light emitting stacked structures to form separation paths that partially separates the light emitting stacked structures from each other. Referring to FIG. 12, a first bonding layer 95 is attached to the substrate 11, and the substrate 11 may be cut or broken by using various known methods in the art to singularize each of the light emitting chips 100, while being attached to the first bonding layer 95. For example, the substrate 11 may be cut by dicing the substrate 11 through scribing lines formed thereon, or by applying mechanical force to cause the substrate 11 to be broken along the separation path formed during the laser radiation process, for example. The first bonding layer 95 may be a tape, however, the inventive concepts are not limited thereto, so long as the first bonding layer 95 stably attaches the light emitting chips 100 while being capable of detaching the light emitting chips 100 during subsequent processes. Although the first bonding layer 95 is described above as being attached onto the substrate 11 after the laser radiation step, however, in some exemplary embodiments, the first bonding layer 95 may be attached onto the substrate 11 prior to the laser radiation step.

FIGS. 14, 15, 16, and 17 are cross-sectional views schematically illustrating a process of manufacturing a light emitting package according to an exemplary embodiment. The light emitting chip 100 according to exemplary embodiments may be transferred and be packaged via various methods known in the art. Hereinafter, the light emitting chip 100 will be exemplarily described as being transferred by attaching a second adhesive layer 13 on the substrate 11 using a carrier substrate 11c, however, the inventive concepts are not limited to a particular transferring method.

Figure 14:
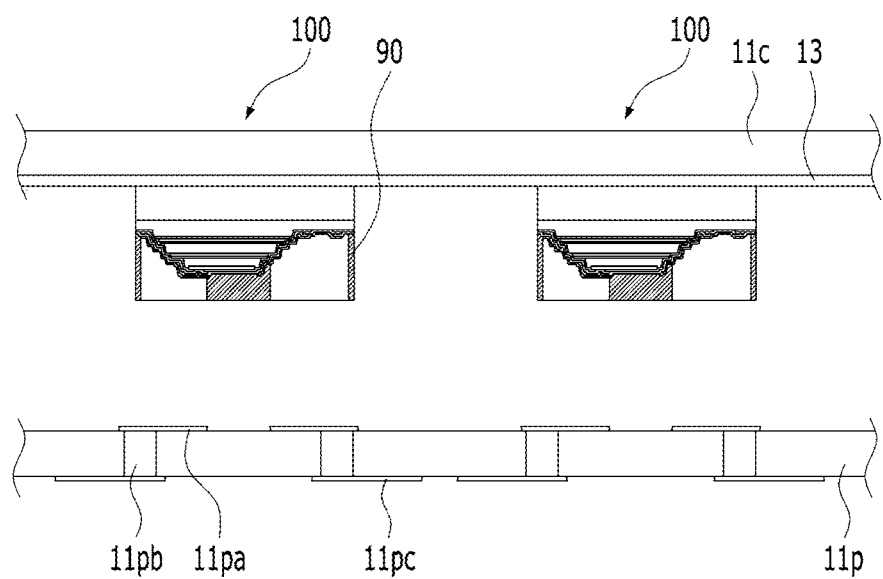
FIGS. 14, 15, and 16A are cross-sectional views schematically illustrating a process of manufacturing a light emitting package according to an exemplary embodiment.

Referring to FIG. 14, according to an exemplary embodiment, the singularized light emitting chips 100 may be transferred and be disposed on the carrier substrate 11c by the second adhesive layer 13 interposed therebetween. In this case, when a light emitting chip includes connection electrodes that project outwardly from the light emitting stacked structure, various problems may occur during subsequent processes, especially in the transferring process, due to its uneven structure as described above. Moreover, when the light emitting chips include a micro-LED, which has a surface area less than about 10,000 square μm, or less than about 4,000 square μm, or less than about 2,500 square μm, depending upon applications, handling of the light emitting chips may become more difficult due to its small form factor. However, provision of the light emitting chip 100 according to exemplary embodiments with the passivation layer 90 disposed between the connection electrodes 20ce, 30ce, 40ce, and 50ce, thereby facilitates the handling the light emitting chips 100 during subsequent processes, such as transferring and packaging, as well as protecting the light emitting structure from an external impact and preventing interference of light between adjacent light emitting chips 100.

The carrier substrate 11c is not particularly limited, as long as the carrier substrate 11c stably mounts the light emitting chips 100 thereon with the second adhesive layer 13. The second adhesive layer 13 may be a tape, but the inventive concepts are not limited thereto as long as the second adhesive layer 13 stably attaches the light emitting chips 100 to the carrier substrate 11c, while being capable of detaching the light emitting chips 100 during subsequent processes. In some exemplary embodiments, the light emitting chips 100 of FIG. 13 may be directly transferred to a circuit board 11p without being transferred to a separate carrier substrate 11c. In this case, the carrier substrate 11c shown in FIG. 14 may be the substrate 11, and the second adhesive layer 13 shown in FIG. 14 may be the first bonding layer 95 shown in FIG. 13.

The light emitting chips 100 may be mounted on the circuit board 11p. According to an exemplary embodiment, the circuit board 11p may include upper circuit electrodes 11pa, lower circuit electrodes 11pc, and middle circuit electrodes 11pb disposed therebetween, which are electrically connected to each other. The upper circuit electrodes 11pa may correspond to each of the first, second, third, and fourth connection electrodes 20ce, 30ce, 40ce, and 50ce, respectively. In some exemplary embodiments, the upper circuit electrodes 11pa may be surface treated by ENIG, to facilitate electrical connection to the connection electrodes of the light emitting chip 100 by being partially melt at high temperature.

According to the illustrated exemplary embodiment, the light emitting chips 100 may be spaced apart from each other on the carrier substrate 11c at a desired pitch, preferably in consideration of a pitch P (see FIG. 16B) of the upper circuit electrodes 11pa of the circuit board 11p that is to be mounted on a final target device, such as a display device.

According to an exemplary embodiment, the first, second, third, and fourth connection electrodes 20ce, 30ce, 40ce, and 50ce of the light emitting chips 100 may be bonded to the upper circuit electrodes 11pa of the circuit board 11p, respectively, by an anisotropic conductive film (ACF) bonding, for example. When the light emitting chips 100 are bonded to the circuit board through ACF bonding, which may be performed at a lower temperature than in other bonding methods, the light emitting chips 100 may be protected from being exposed to a high temperature during bonding. However, the inventive concepts are not limited to a particular bonding method. For example, in some exemplary embodiments, the light emitting chips 100 may be bonded to the circuit board 11p using an anisotropic conductive paste (ACP), solder, ball grid area (BGA), or micro bumps including at least one of Cu and Sn. In this case, since the upper surfaces of the connection electrodes 20ce, 30ce, 40ce, and 50ce and the passivation layer 90 are substantially flush with each other from a polishing process or the like, the adhesiveness of the light emitting chips 100 to an anisotropic conductive film may be increased, thereby forming a more stable structure when bonded to the circuit board 11p.

Figure 15:
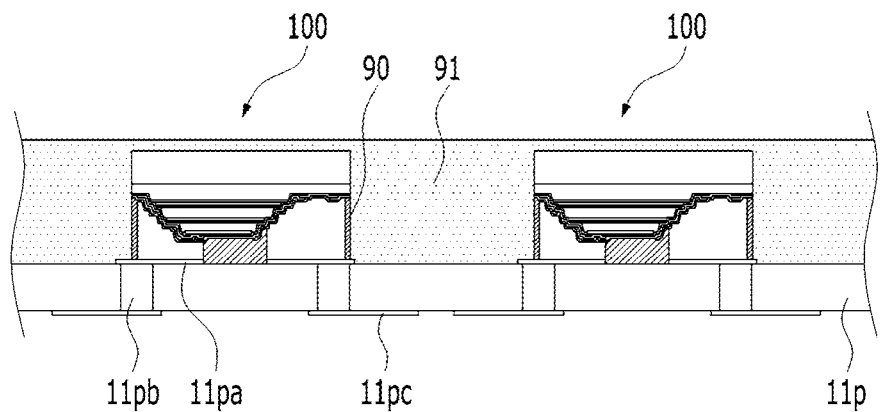

Referring to FIG. 15, a molding layer 91 is formed between the light emitting chips 100. According to an exemplary embodiment, the molding layer 91 may transmit a portion of light emitted from the light emitting chip 100, and may also reflect, diffract, and/or absorb a portion of external light to prevent the external light from being reflected by the light emitting chip 100 towards a direction that may be visible to a user. The molding layer 91 may cover at least a portion of the light emitting chip 100 to protect the light emitting chip 100 from external moisture and stress. In addition, together with the passivation layer 90 formed on the light emitting chip 100, the molding layer 91 provides an additional protection to the light emitting package by reinforcing its structure.

According to an exemplary embodiment, when the molding layer 91 covers a top surface of the substrate 11 facing away the circuit board 11p, the molding layer 91 may have a thickness less than about 100 μm to at least transmit 50% of light emitted from the light emitting chip 100. In an exemplary embodiment, the molding layer 91 may include an organic or an inorganic polymer. In some exemplary embodiments, the molding layer 91 may additionally include pillars, such as silica or alumina. In some exemplary embodiments, the molding layer 91 may include the same material as the passivation layer 90. The molding layer 91 may be formed through various methods known in the art, such as lamination, plating, and/or printing methods. For example, the molding layer 91 may be formed by a vacuum laminate process, in which an organic polymer sheet is disposed on the light emitting chip 100, and high temperature and pressure are applied in vacuum, to improve light uniformity by providing a substantially planar top surface of the light emitting package.

In some exemplary embodiments, the substrate 11 may be removed from the light emitting chips 100 before the molding layer 91 is formed thereon. When the substrate 11 is a patterned sapphire substrate, concave-convex portions may be formed on the first-type semiconductor layer 41 of the third light emitting stack 40 that contacted the substrate 11 to improve light efficiency. In another exemplary embodiment, concave-convex portions may be formed on the first-type semiconductor layer 41 of the third light emitting stack 40 by etching or patterning, as known in the art.

Figure 16A:
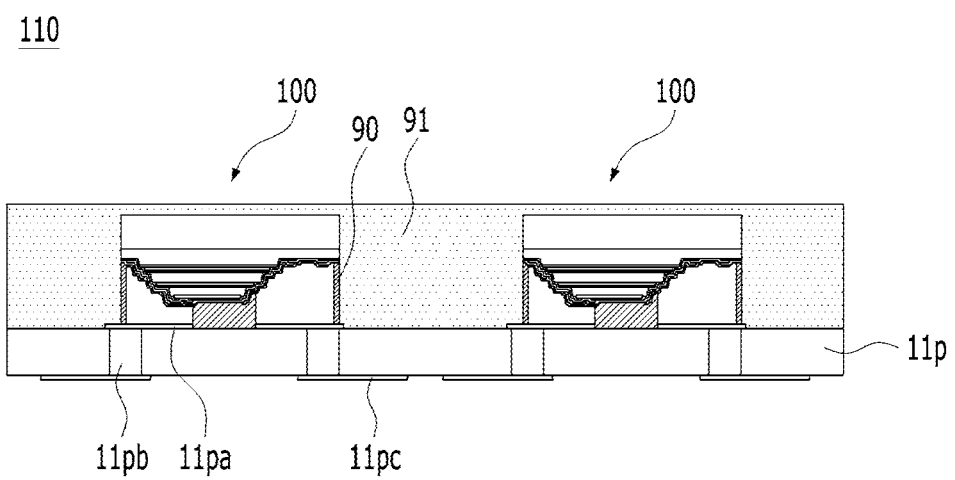
Figure 16B:
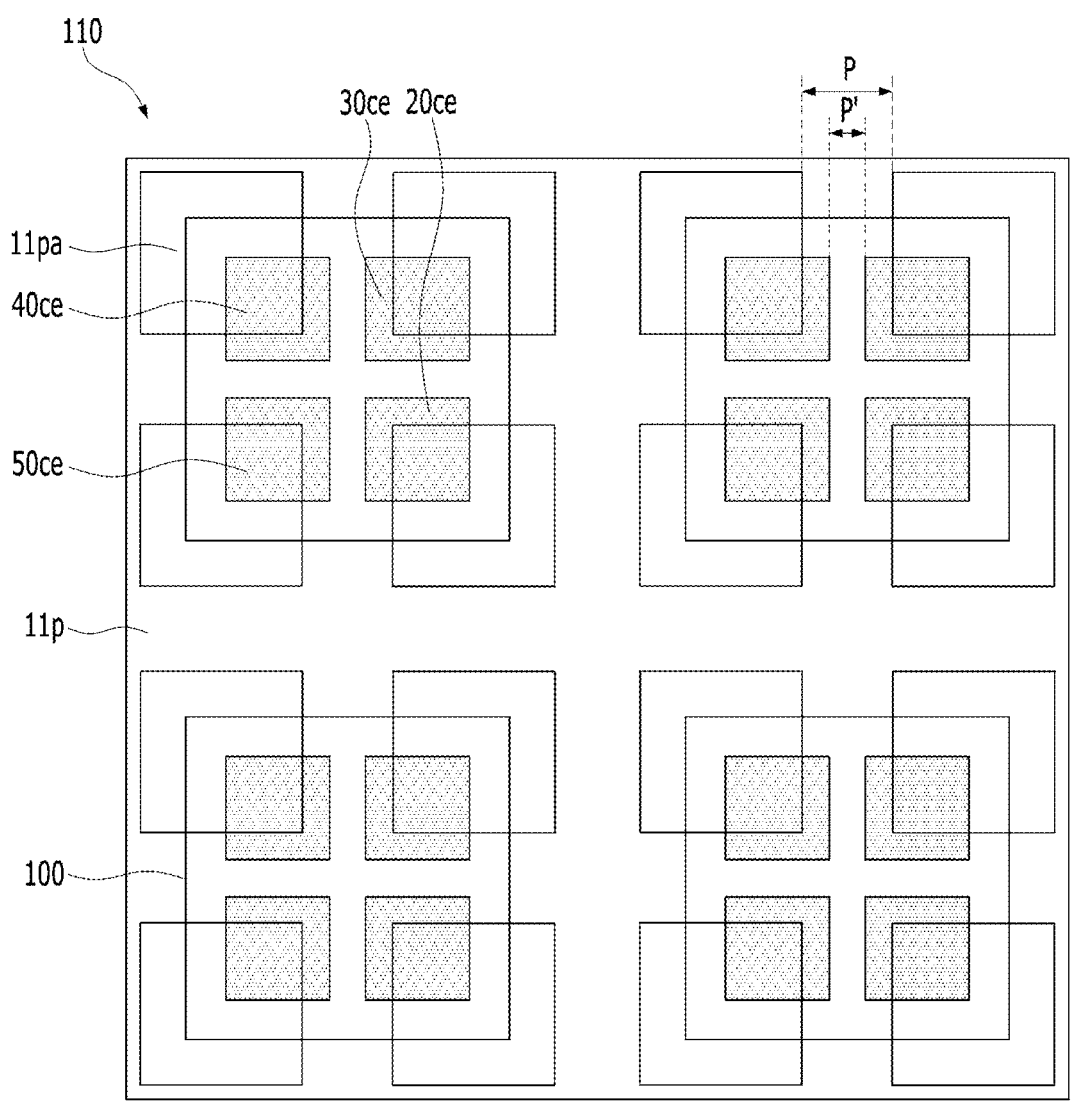
FIG. 16B is a schematic plan view of the light emitting package of FIG. 16A according to an exemplary embodiment.

Referring to FIGS. 16A and 16B, the light emitting chips 100 disposed on the circuit board 11p may be cut in a desired configuration to be formed as a light emitting package 110. For example, the light emitting package 110 shown in FIG. 16B includes 4 light emitting chips 100 (2×2) disposed on the circuit board 11p. However, the inventive concepts are not limited to a particular number of light emitting chips formed in the light emitting package 110. For example, in some exemplary embodiments, the light emitting package 110 may include one or more light emitting chips 100 formed on the circuit board 11p. In addition, the inventive concepts are not limited to a particular arrangement of one or more light emitting chips 100 in the light emitting package 110. For example, one or more light emitting chips 100 in the light emitting package 110 may be arranged in n×m arrangement, where n and m are natural numbers. According to an exemplary embodiment, the circuit board 11p may include scan lines and data lines to independently drive each of the light emitting chips 100 included in the light emitting package 110.

Figure 17:
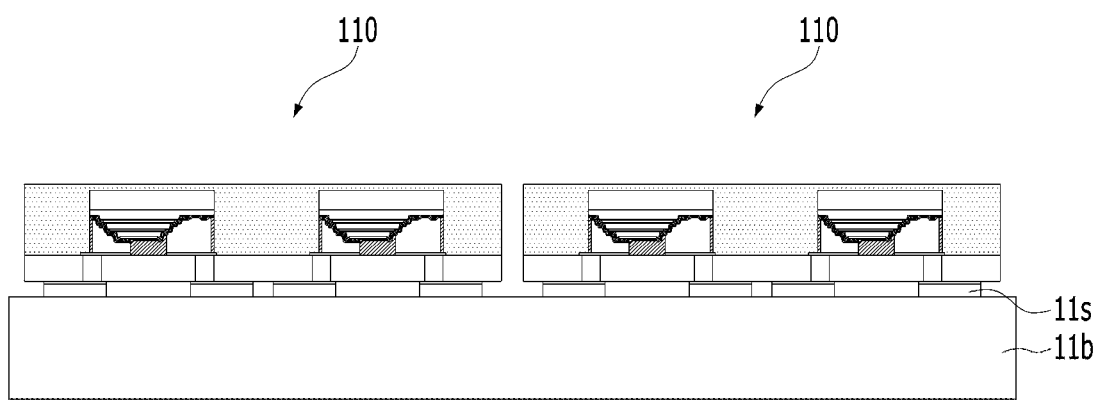
FIG. 17 is a schematic cross-sectional view of a light emitting package mounted on a target device according to an exemplary embodiment.

Referring to FIG. 17, the light emitting packages 110 may be mounted on a target substrate 11b of a final device, such as a display device. The target substrate 11b may include target electrodes 11s corresponding to the lower circuit electrodes 11pc of the light emitting package 110, respectively. According to an exemplary embodiment, the display device may include a plurality of pixels, and each of the light emitting chips 100 may be disposed to correspond to each pixel. More particularly, each of the light emitting stacks of the light emitting chip 100 according to the exemplary embodiments may correspond to each sub-pixel of one pixel. Since the light emitting chip 100 includes vertically stacked light emitting stacks 20, 30, and 40, the number of chips that would need to be transferred for each sub-pixel may be substantially reduced than that in a conventional light emitting device. In addition, since the opposing surfaces of the connection electrodes have different lengths, the connection electrodes may be stably formed on the light emitting stacked structure, thereby reinforcing its internal structure. Furthermore, since the light emitting chip 100 according to some exemplary embodiments includes the passivation layer 90 between the connection electrodes, the light emitting chip 100 may be protected from external impact.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting chip, comprising:
   a first LED sub-unit;
   a second LED sub-unit disposed on the first LED sub-unit;
   a third LED sub-unit disposed on the second LED sub-unit;
   a first bonding layer interposed between the first and second LED sub-units;
   a second bonding layer interposed between second and third LED sub-units; and
   a plurality of first connection electrodes electrically connected to and overlapping at least one of the first, second, and third LED sub-units, each of the first connection electrodes having first and second opposing side surfaces, the first side surface having a first length and the second side surface having a second length greater than the first length,
   wherein the difference in length between the first side surface and the second side surface of the first connection electrode is greater than a thickness of at least one of the LED sub-units,
   wherein the first side surface of the first connection electrode is substantially continuous and overlaps the first LED sub-unit, and the first length is greater than the thickness of at least one of the LED sub-units, and
   wherein a shortest distance between the second sides surfaces of adjacent first connection electrodes is greater than a shortest distance between the first side surfaces of the adjacent first connection electrodes.

2. The light emitting chip of claim 1, further comprising:
   a substrate on which the first LED sub-unit is disposed and through which light emitted from the first LED sub-unit is configured to pass; and
   a passivation layer at least partially surrounding the first connection electrode and exposing a side surface of the substrate.

3. The light emitting chip of claim 1, wherein the first side surface faces the outside of the light emitting chip and the second side surface faces the center of the light emitting chip.

4. The light emitting chip of claim 2, wherein the passivation layer exposes a side surface of the first LED sub-unit, and covers side surfaces of at least one of the second and third LED sub-units.

5. The light emitting chip of claim 2, wherein the passivation layer comprises at least one of an epoxy molding compound and a polyimide film; and
   the passivation layer covers an upper surface of the third LED sub-unit.

6. The light emitting chip of claim 5, wherein the passivation layer transmits light emitted from the first, second, and third LED sub-units.

7. The light emitting chip of claim 2, wherein a thickness of a portion of the passivation layer overlapping the third LED sub-unit is less than about 100 μm.

8. The light emitting chip of claim 1, further comprising:
a substrate on which the first LED sub-unit is disposed;
a second connection electrode electrically connected to the first LED sub-unit;
a third connection electrode electrically connected to the second LED sub-unit; and
a fourth connection electrode electrically connected to the third LED sub-unit,
wherein:
the first LED sub-unit has a greater width than the third LED sub-unit;
the first connection electrode is electrically connected to each of the first, second, and third LED sub-units; and
each of the first, second, third, and fourth connection electrodes has an elongate shape projecting in a direction away from the substrate, such that a top surface thereof is disposed above a top surface of the third LED sub-unit.

9. The light emitting chip of claim 8, wherein a bottom surface of at least one of the first, second, third, and fourth connection electrodes has a greater area than its respective top surface thereof.

10. The light emitting chip of claim 8, wherein at least one of the first, second, third, and fourth connection electrodes overlaps a side surface of each of the first, second, and third LED sub-units.

11. The light emitting chip of claim 1, wherein the first connection electrode is electrically connected to each of the first, second, and third LED sub-units via first, second, and third lower contact electrodes, respectively, with the first, second, and third lower contact electrodes being disposed on different planes from each other.

12. The light emitting chip of claim 1, wherein:
the third LED sub-unit comprises a first-type semiconductor layer, an active layer, a second-type semiconductor layer, and an upper contact electrode forming ohmic contact with the first-type semiconductor layer;
the first-type semiconductor layer includes a recessed portion; and
the upper contact electrode is formed in the recessed portion of the first-type semiconductor layer.

13. The light emitting chip of claim 1, further comprising a substrate,
wherein:
the first LED sub-unit comprises a first LED light emitting stack;
the second LED sub-unit comprises a second LED light emitting stack;
the third LED sub-unit comprises a third LED light emitting stack;
the first, second, and third LED light emitting stacks have successively smaller regions overlapping with the substrate; and
at least one of the light emitting stacks comprises a micro-LED having a surface area less than about 10,000 square µm.

14. The light emitting chip of claim 1, wherein the difference in length between the first side surface and the second side surface of the first connection electrode is in a range of about 3 µm to about 16 µm.

* * * * *